(12) United States Patent
Hsieh

(10) Patent No.: US 9,293,527 B1
(45) Date of Patent: Mar. 22, 2016

(54) SUPER-JUNCTION TRENCH MOSFET STRUCTURE

(71) Applicant: Force Mos Technology Co., Ltd., New Taipei (TW)

(72) Inventor: Fu-Yuan Hsieh, New Taipei (TW)

(73) Assignee: Force Mos Technology Co., Ltd. (TW)

( * ) Notice: Subject to any disclaimer, the term of this patent is extended or adjusted under 35 U.S.C. 154(b) by 0 days.

(21) Appl. No.: 14/644,361

(22) Filed: Mar. 11, 2015

Related U.S. Application Data

(63) Continuation-in-part of application No. 14/559,061, filed on Dec. 3, 2014.

(51) Int. Cl.
| | |
|---|---|
| *H01L 29/06* | (2006.01) |
| *H01L 29/78* | (2006.01) |
| *H01L 29/49* | (2006.01) |
| *H01L 29/10* | (2006.01) |
| *H01L 29/417* | (2006.01) |
| *H01L 29/423* | (2006.01) |
| *H01L 29/45* | (2006.01) |

(52) U.S. Cl.
CPC ........ *H01L 29/0634* (2013.01); *H01L 29/0696* (2013.01); *H01L 29/1095* (2013.01); *H01L 29/41766* (2013.01); *H01L 29/4236* (2013.01); *H01L 29/45* (2013.01); *H01L 29/4916* (2013.01); *H01L 29/7811* (2013.01); *H01L 29/7813* (2013.01); *H01L 29/7827* (2013.01)

(58) Field of Classification Search
CPC .................... H01L 29/7813; H01L 29/66734; H01L 29/7825
See application file for complete search history.

(56) References Cited

U.S. PATENT DOCUMENTS

| | | | | |
|---|---|---|---|---|
| 2002/0006703 | A1* | 1/2002 | Pfirsch et al. | 438/268 |
| 2006/0270150 | A1* | 11/2006 | Lee | 438/243 |
| 2010/0314682 | A1* | 12/2010 | Yilmaz et al. | 257/328 |
| 2012/0261737 | A1* | 10/2012 | Hsieh | 257/315 |
| 2013/0105886 | A1* | 5/2013 | Lui et al. | 257/330 |

\* cited by examiner

*Primary Examiner* — Kevin Parendo
(74) *Attorney, Agent, or Firm* — Bacon & Thomas, PLLC

(57) ABSTRACT

A super-junction trench MOSFET is disclosed by applying a first doped column region of first conductivity type between a pair of second doped column regions of second conductivity type adjacent to sidewalls of a pair of deep trenches with buried voids in each unit cell for super-junction. A buffer poly-silicon layer is deposited above the buried void for stress release to prevent wafer crack and silicon defects.

8 Claims, 24 Drawing Sheets

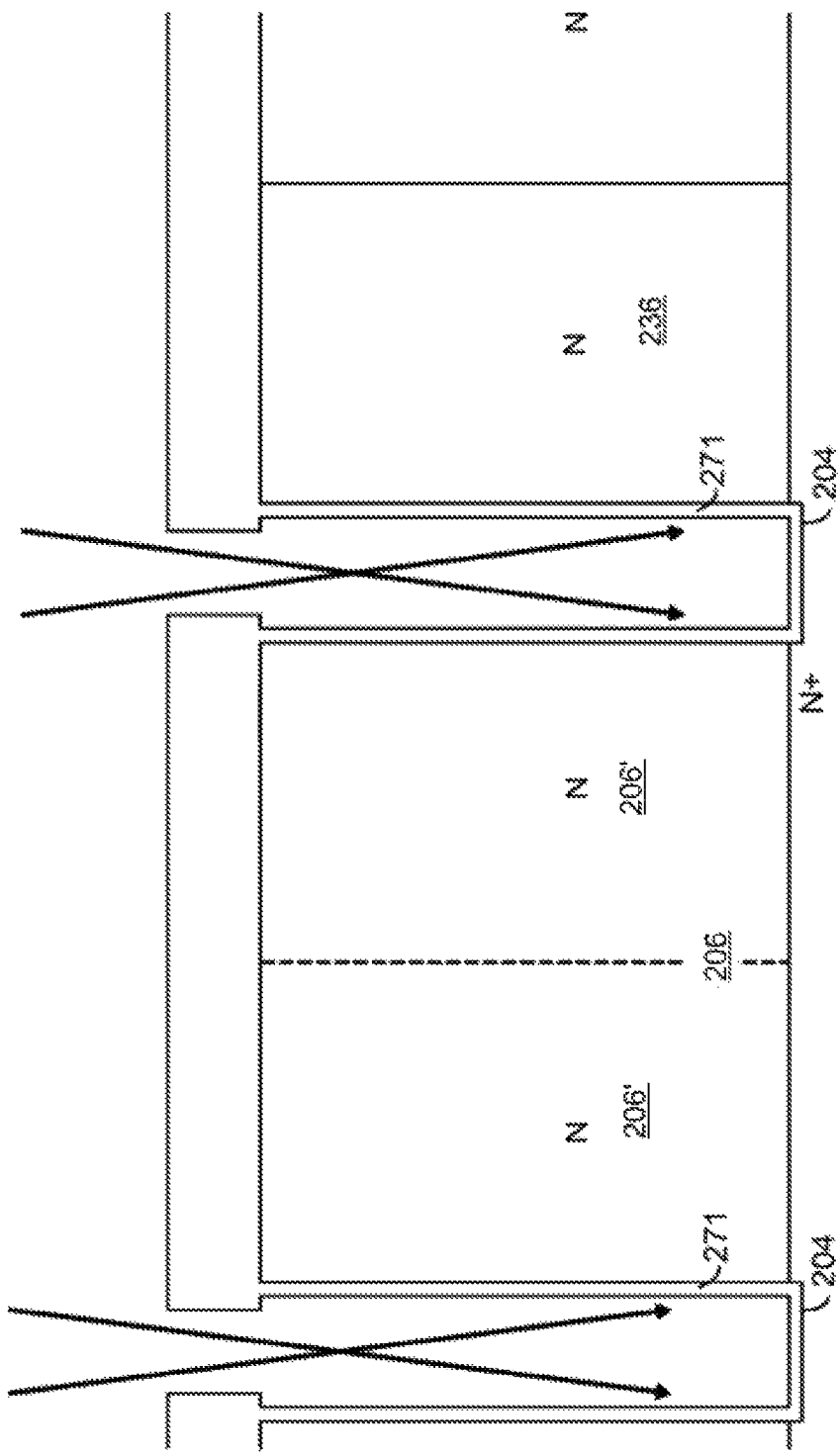

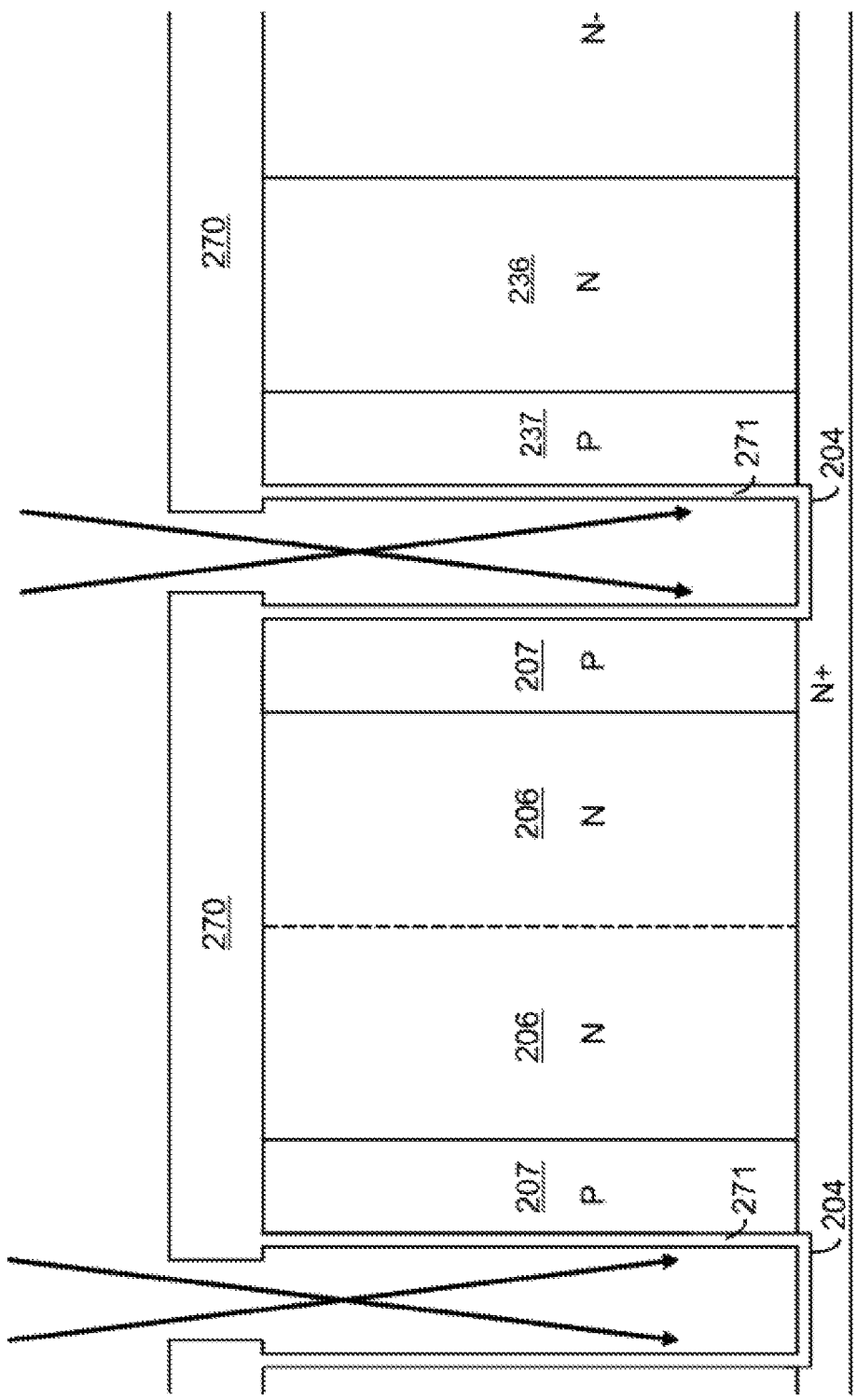

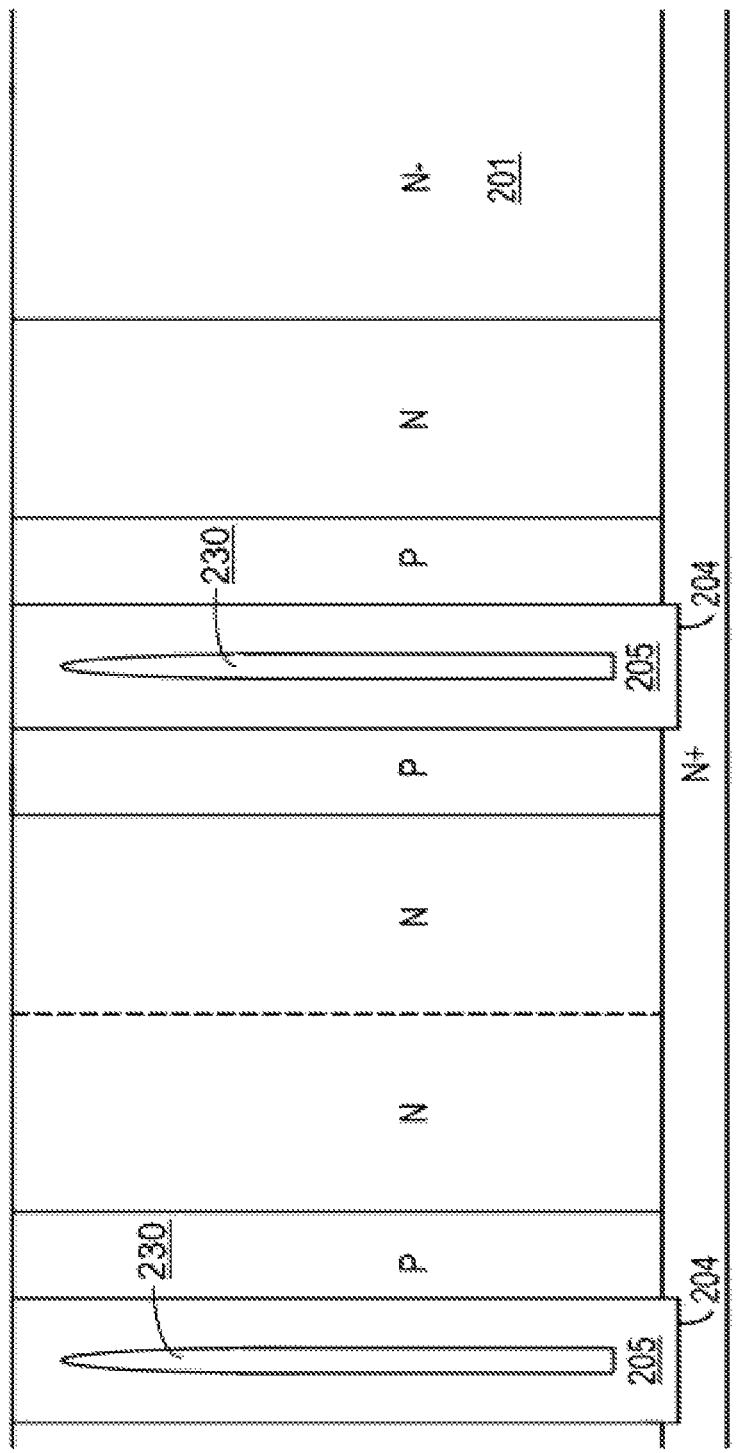

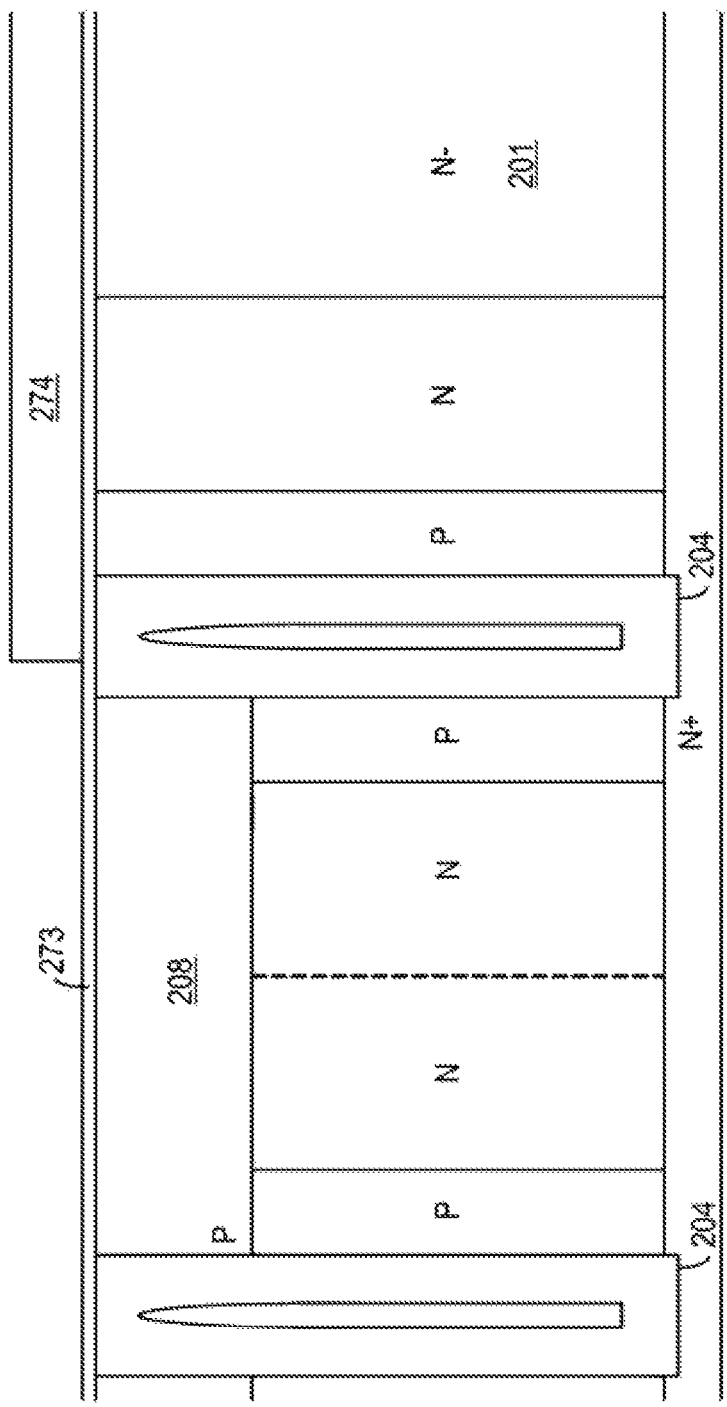

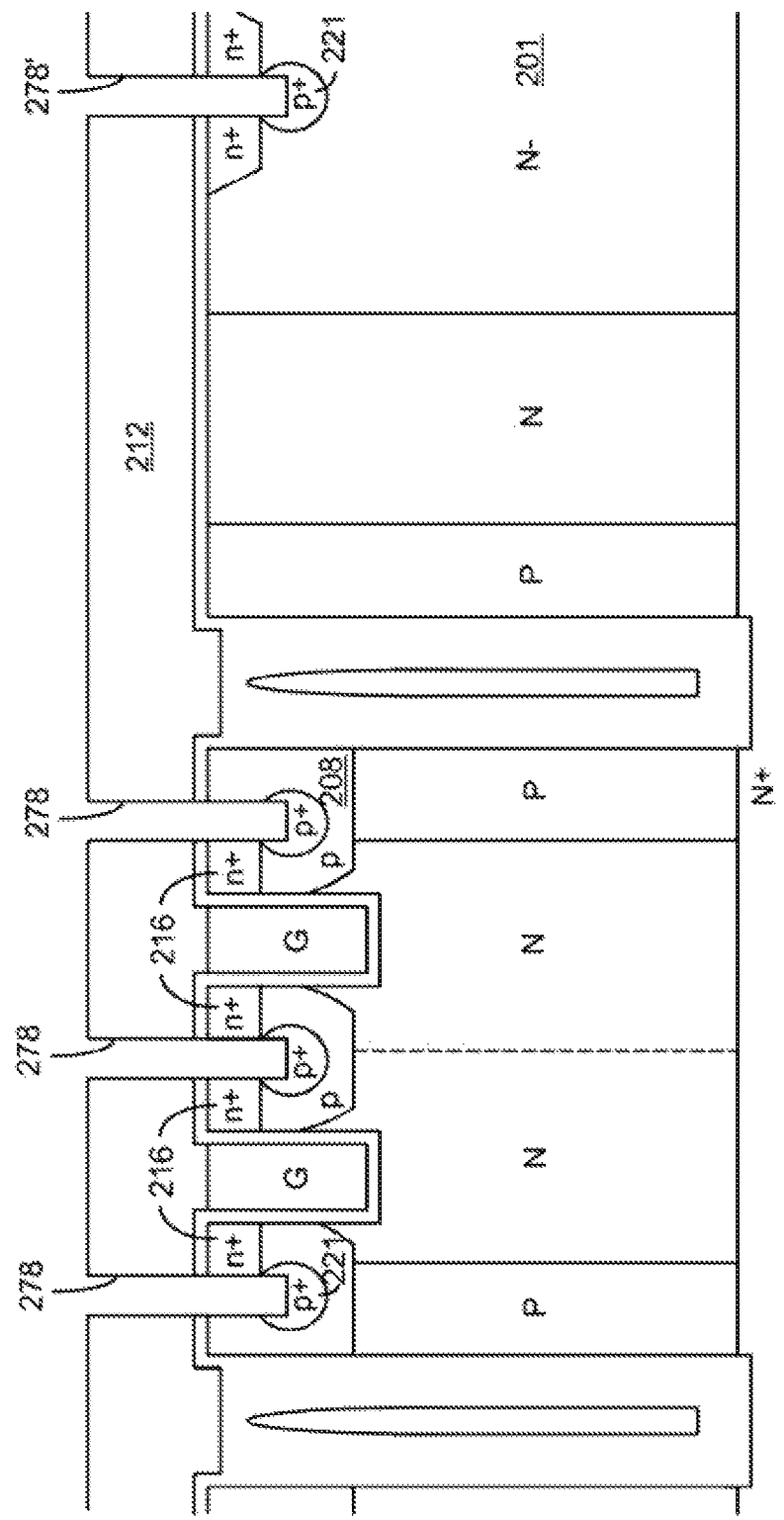

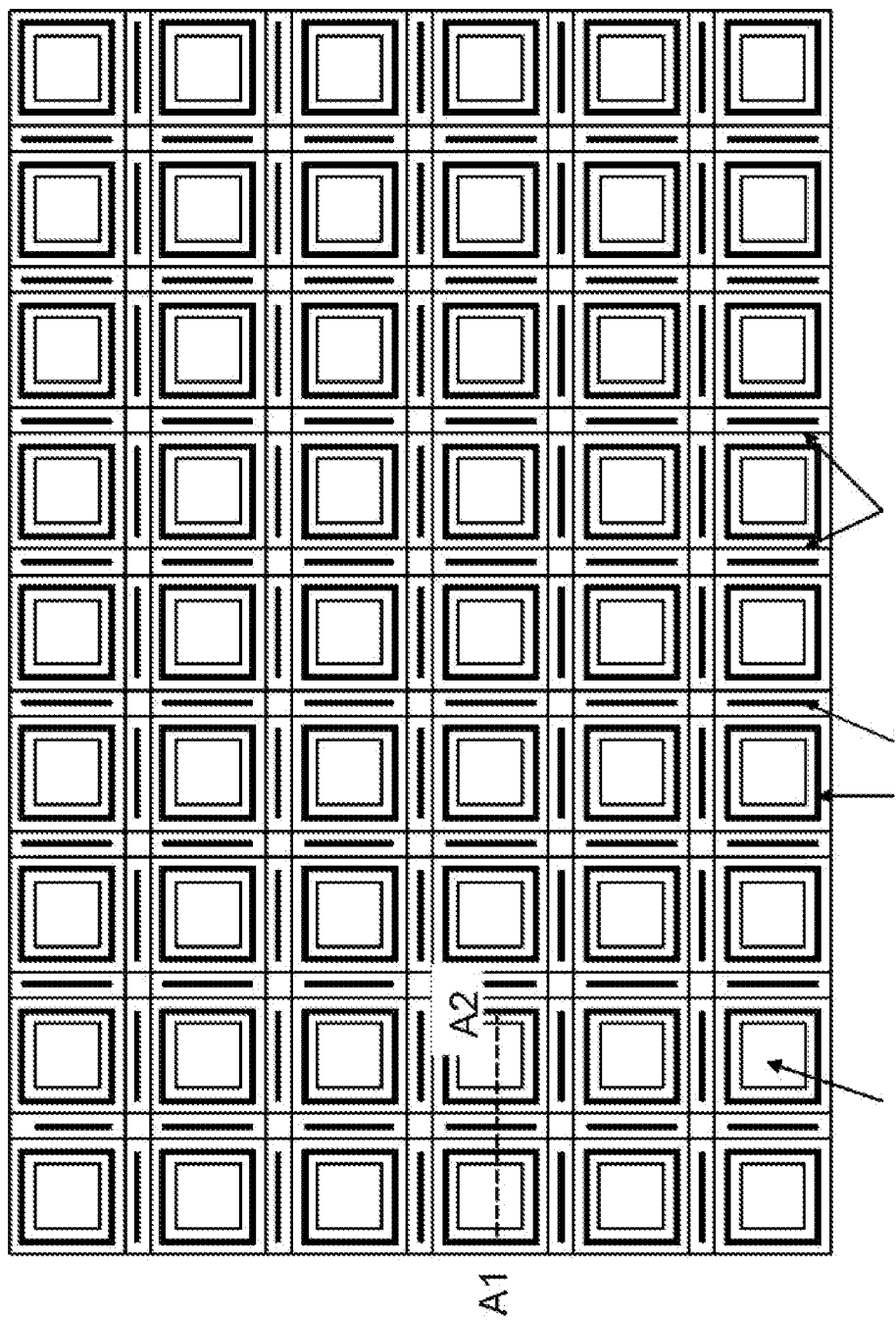

SUPER-JUNCTION TRENCH MOSFET STRUCTURE

CROSS REFERENCE TO RELATED APPLICATIONS

This application is a Continuation-In-Part (CIP) of U.S. patent application Ser. No. 14/559,061 of the same inventor, filed on Dec. 3, 2014, entitled "super-junction trench MOSFETs with closed cell layout".

FIELD OF THE INVENTION

This invention relates generally to the cell structure, device configuration and fabrication process of semiconductor power devices. More particularly, this invention relates to a novel and improved cell structure, device configuration and improved process of a super junction trench metal oxide semiconductor field effect transistor (MOSFET, the same hereinafter).

BACKGROUND OF THE INVENTION

Compared with the conventional trench MOSFETs, super-junction trench MOSFETs are more attractive due to higher breakdown voltage and lower specific Rds (drain-source resistance). As shown in FIG. 1, U.S. patent application Ser. No. 13/751,458 of the same inventor as the present invention discloses a super-junction trench MOSFET 100 comprising a termination area including multiple guard rings ("GR", as illustrated in FIG. 1), wherein the termination area is about 200 um in length due to the multiple guard rings. However, for the integration of semiconductor power devices is more and more advanced, a super-junction trench MOSFET with short termination is admired because it takes up less space and is more cost effective due to its smaller device size.

Therefore, there is still a need in the art of the semiconductor power device, particularly for super-junction trench MOSFET design and fabrication, to provide a novel cell structure, device configuration and fabrication process that would resolve these difficulties and design limitations.

SUMMARY OF THE INVENTION

The present invention provides a super-junction trench MOSFET having short termination about 20 um in length, shortening termination length to about one tenth compared with the prior art, which is more flexible in applications and more cost effective due to its smaller device size.

According to an aspect, the present invention features a super junction trench MOSFET comprising a plurality of unit cells with each unit cell in an active area having a first type charge balance area consist of two P/N charge balance areas formed in the mesa area between adjacent deep trenches, comprising: a substrate of a first conductivity type; an epitaxial layer of the first conductivity type grown on the substrate, the epitaxial layer having a lower doping concentration than the substrate; a plurality of deep trenches filled with dielectric material, starting from a top surface of the epitaxial layer and down extending into the substrate, each comprising a void inside the dielectric material; a mesa between the pair of deep trenches; a first doped column region of the first conductivity type with column shape within each the mesa; a pair of second doped column regions of a second conductivity type with column shape adjacent to sidewalls of the pair of deep trenches within the mesa, in parallel with and surrounding the first doped column region forming a first type charge balance area in conjunction with the first doped column region; a body region of the second conductivity type in the mesa, covering a top surface of the first and second doped column regions, extending between the deep trenches; at least one gate trench filled with doped poly-silicon layer padded by a gate oxide layer, starting from the top surface of the epitaxial layer and down penetrating through the body region and extending into the first doped column in the mesa; multiple trenched source-body contacts with each filled with a contact metal plug extending into the body region in the mesa; a source region of the first conductivity type surrounding an upper portion of each the gate trench, extending between the upper portion of each the gate trench and sidewalls of adjacent trenched source-body contacts; and a termination area comprising a second type P/N charge balance area and a channel stop region formed near the top surface of the epitaxial layer with a doping concentration higher than the epitaxial layer.

According to another aspect of the present invention, in some preferred embodiments, the third doped column region in the termination area has about half column width of the first doped column region and the fourth doped column region has about same column width as the second doped column region in the unit cells.

According to another aspect of the present invention, in some preferred embodiments, the channel stop region has a trenched termination contact penetrating through the channel stop region.

According to another aspect of the present invention, in some preferred embodiments, the super-junction trench MOSFET further comprises a body contact region of the second conductivity type surrounding at least bottom of each of the multiple trenched source-body contacts, wherein the body contact region has a higher doping concentration than the body region.

According to another aspect of the present invention, in some preferred embodiments, the super-junction trench MOSFET further comprises a body contact region of the second conductivity type surrounding at least bottom of the trenched termination contact, wherein the body contact region has a higher doping concentration than the body region.

According to another aspect of the present invention, in some preferred embodiments, the contact metal plug is a tungsten plug padded by a barrier metal layer of Ti/TiN or Co/TiN or Ta/TiN.

According to another aspect of the present invention, in some preferred embodiments, the super-junction trench MOSFET further comprises an equal potential ring metal covering the trenched termination contact in the termination area and a passivation layer covering a top surface of the termination area.

According to another aspect of the present invention, in some preferred embodiments, the void inside the deep trench in the termination area is not opened up in air.

According to another aspect of the present invention, in some preferred embodiments, the void inside the deep trench in the termination area is opened up in air. And in some preferred embodiments, the super-junction trench MOSFET further comprises a passivation layer covering above the void inside the deep trench in the termination area.

According to another aspect of the present invention, in some preferred embodiments, a buffer poly-silicon layer is formed on top of the void in deep trenches for stress release to prevent silicon defects and wafer crack.

The present invention also features a method for manufacturing a super-junction trench MOSFET comprising the steps of: forming a plurality of deep trenches in active area inside an epitaxial layer of a first conductivity type onto a substrate of the first conductivity type; carrying out angle ion implantations of the first conductivity type dopant and diffusion through the deep trenches to form a first doped column region of the first conductivity type with column shape within a mesa area between every two adjacent of the deep trenches; carrying out angle ion implantations of a second conductivity type dopant and diffusion through the deep trenches to form second doped column regions of the second conductivity type with column shape adjacent to sidewalls of the deep trenches, in parallel with and surrounding the first doped column region; forming a third doped column of the first conductivity type and a fourth doped column of the second conductivity through a deep trench in termination area simultaneously with the first doped column and the second doped column within the mesa, respectively; depositing a dielectric material with voids in the deep trenches; removing the dielectric material from top surface of the epitaxial layer; forming a pad oxide layer prior to forming body regions; and forming a channel stop region near the top surface of the epitaxial layer in the termination area and source regions in the active area at same step by carrying out source ion implantation; depositing a contact interlayer on the top surface of the epitaxial layer; forming a trenched termination contact penetrating through the channel stop region into the epitaxial layer in the termination area and multiple trenched source-body contacts in the active area by doing successively dry oxide etch and dry silicon etch; and depositing a tungsten layer and then etching back to form contact metal plugs respectively filled in the trenched termination contacts and the multiple trenched source-body contacts.

According to another aspect of the present invention, a super-junction trench MOSFET with closed cell layout is disclosed, wherein closed gate trenches surrounding a deep trench in each unit cell. Trenched source-body contacts are disposed between the closed gate trenches and the deep trench. In some preferred embodiments, the deep trench has square, rectangular, circle or hexagon shape. In some preferred embodiments, the trenched source-body contacts have square, rectangular, circle or hexagon shape. In some preferred embodiments, trenched source-body contacts are also disposed between the adjacent closed gate trenches.

According to another aspect of the present invention, in some preferred embodiments, the super-junction trench MOSFET further comprises a body contact region of the second conductivity type surrounding at least bottom of each of the trenched source-body contacts, wherein the body contact region has a higher doping concentration than the body region.

According to another aspect of the present invention, in some preferred embodiments, wherein the contact metal plug is a tungsten plug padded by a barrier metal layer of Ti/TiN or Co/TiN or Ta/TiN.

According to another aspect of the present invention, in some preferred embodiments, a layer of buffer poly-silicon is deposited on top of the void in each of the deep trenches for stress release to prevent silicon defects and wafer crack. More preferred, said buffer poly-silicon can be implemented by using non-doped poly-silicon or doped poly-silicon. More preferred, said buffer poly-silicon can be implemented to have floating voltage or be connected to source metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 4A-4K are a serial of cross-sectional views for showing the processing steps for fabricating the super-junction trench MOSFET according to the present invention.

FIG. 6 is a top view of super-junction trench MOSFETs with square closed cell layout.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
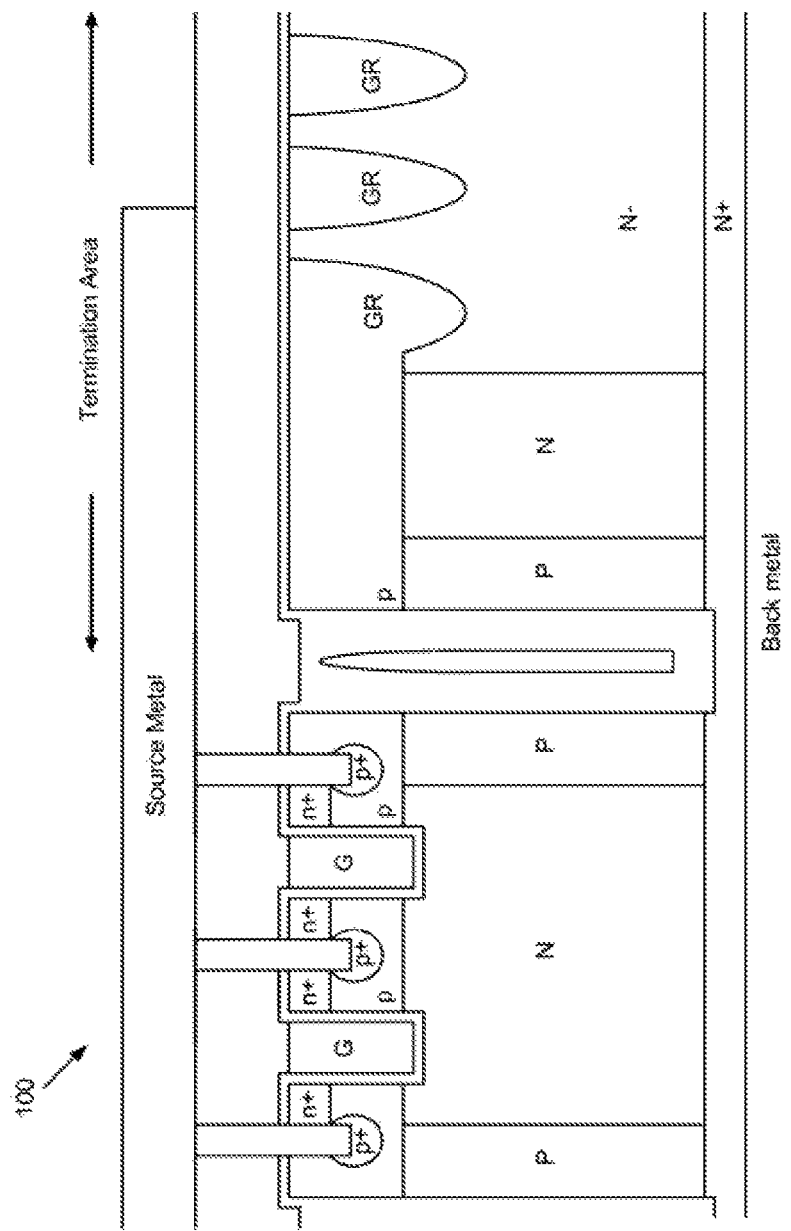
FIG. 1 is a cross-sectional view of a super junction trench MOSFET of U.S. patent application Ser. No. 13/751,458 of the same inventor.
Figure 2A:
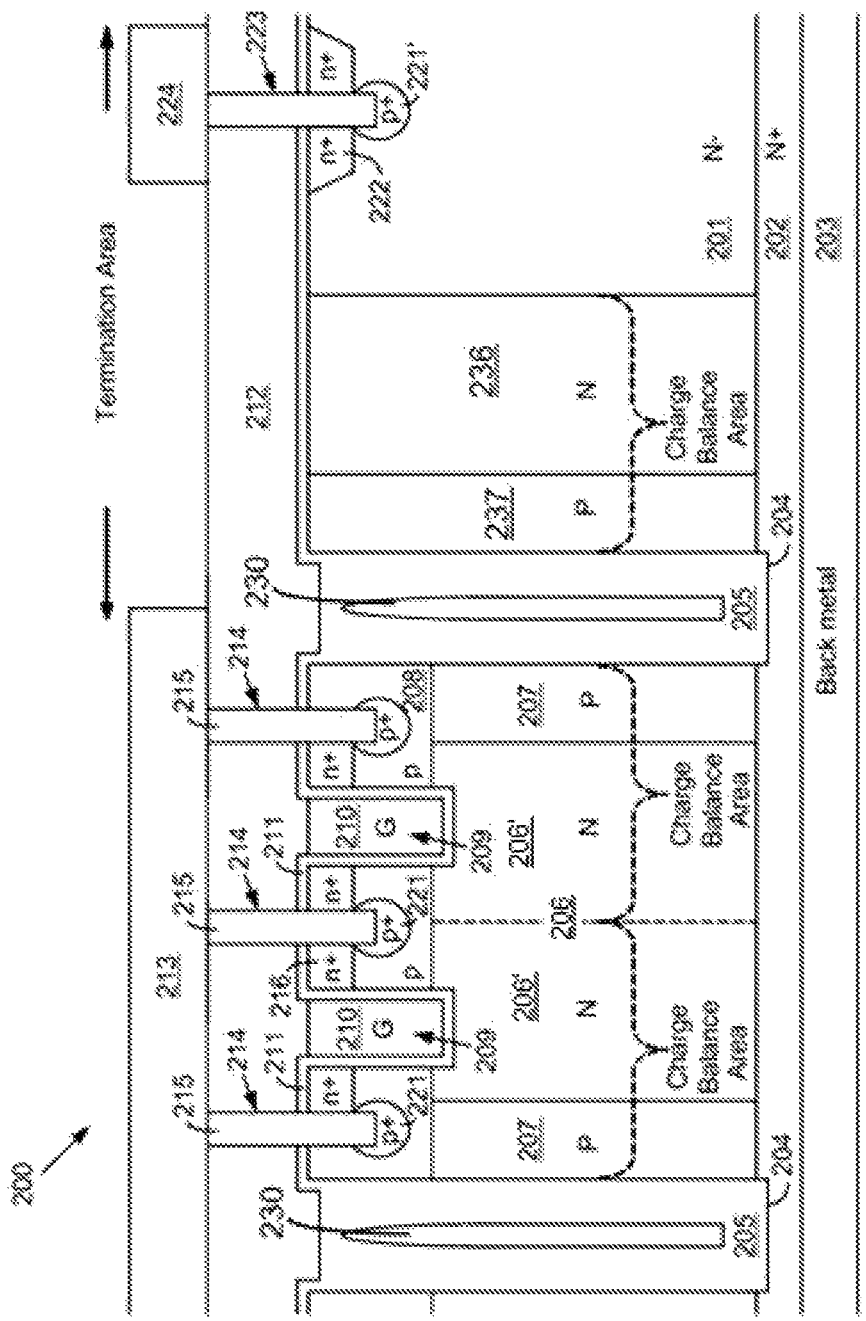
FIG. 2A is a cross-sectional view of a preferred embodiment according to the present invention.

Please refer to FIG. 2A for a preferred embodiment of this invention wherein an N-channel super-junction trench MOSFET 200 is formed in an N− epitaxial layer 201 supported onto an N+ substrate 202 which coated with a back metal 203 of Ti/Ni/Ag on its rear side as drain metal. The N-channel super junction trench MOSFET 200 comprises a plurality of unit cells with each comprising a plurality of deep trenches 204 formed starting from a top surface of the N− epitaxial layer 201 and vertically down extending into the N+ substrate 202. Inside each of the deep trenches 204, a thick dielectric layer 205 with a buried void 230 is formed therein. A mesa is therefore formed between every two adjacent of the deep trenches 204 in each unit cell wherein an N first doped column region 206 consist of two N sub-doped column regions 206' with each having half column width of the N first doped column region 206 is formed. Adjacent to sidewalls of the deep trenches 204, a pair of P second doped column regions 207 is formed in the mesa and in parallel surrounding with the N first doped column region 206. A first type charge balance area comprising two P/N charge balance areas is formed in the mesa area between the adjacent deep trenches. The N first doped column region 206 and the P second doped column regions 207 all have column bottoms above trench bottoms of the deep trenches 204. Onto a top surface of the N first doped column region 206 and the P second doped column regions 207, a p body region 208 is formed between in the mesa extending between every two adjacent of the deep trenches 204. A pair of gate trenches 209 are penetrating through the p body region 208 and further extending into the N first doped column region 206 in each unit cell, wherein the pair of gate trenches 209 each comprises a gate electrode 210 padded by a gate oxide layer 211. In some preferred embodiments, there is only one gate trench penetrating through the p body region and further extending into the N first doped column region in each unit cell as an alternative. Onto a top surface of the gate electrodes 210, a contact interlayer 212 is formed to isolate the gate electrodes 210 from a source metal 213. In each the mesa, multiple trenched source-body contacts 214 with each filled with a tungsten plug 215 are formed penetrating through the contact interlayer 212 and extending into the p body region 208 in each unit cell, and an n+ source regions 216 is formed surrounding an upper portion of the gate trenches 209, extending between the upper portion of the gate trenches 209 and sidewalls of adjacent trenched source-body contacts 214. Therefore, the p body region 208 and the n+ source region 216 are connected to the source metal 213 via the multiple trenched source-body contacts 214. Furthermore, a p+ body contact region 221 is formed surrounding at least bottom of each the trenched source-body contact 214 to reduce the contact resistance between the tungsten plugs 215 and the p body region 208. As shown in dashed brace, each the P second doped column region 207 and the adjacent N sub-doped column region constitute the P/N charge balance area. In the termination area, an N third doped column region 236 and a P fourth doped column region 237 near a deep trench 204 filled with the thick dielectric layer 205 having a void 230, constitute a second type charge balance area, wherein the N third doped column region 236 has about half column width of the N first doped column region 206 and the fourth doped column region 237 has about same column width as the second doped column region 207 in the unit cell. Therefore, there is no need to have multiple guard rings in the termination area as in the prior art. Moreover, top surface of the void 230 in FIG. 2A is sealed with the thick dielectric layer 205. Besides, an n+ channel stop region 222 is formed near the top surface of the N- epitaxial layer 201 with a trenched termination contact 223 penetrating through the contact interlayer 212, the n+ channel stop region 222 and further into the N- epitaxial layer 201, wherein the trenched termination contact 223 has a same filling material with the trenched source-body contact 214 and is connected to an equal potential ring (EPR, the same hereinafter) metal 224. A p+ body contact region 221' is formed surrounding at least bottom of the trenched termination contact 223 to reduce the contact resistance. In this preferred embodiment, all the contact metal plugs can be implemented by using a tungsten plug padded by a barrier metal layer of Ti/TiN or Co/TiN or Ta/TiN. Therefore, the termination area according to the present invention is about 20 um in length, shortening termination length to about one tenth compared with the prior art.

Figure 2B:
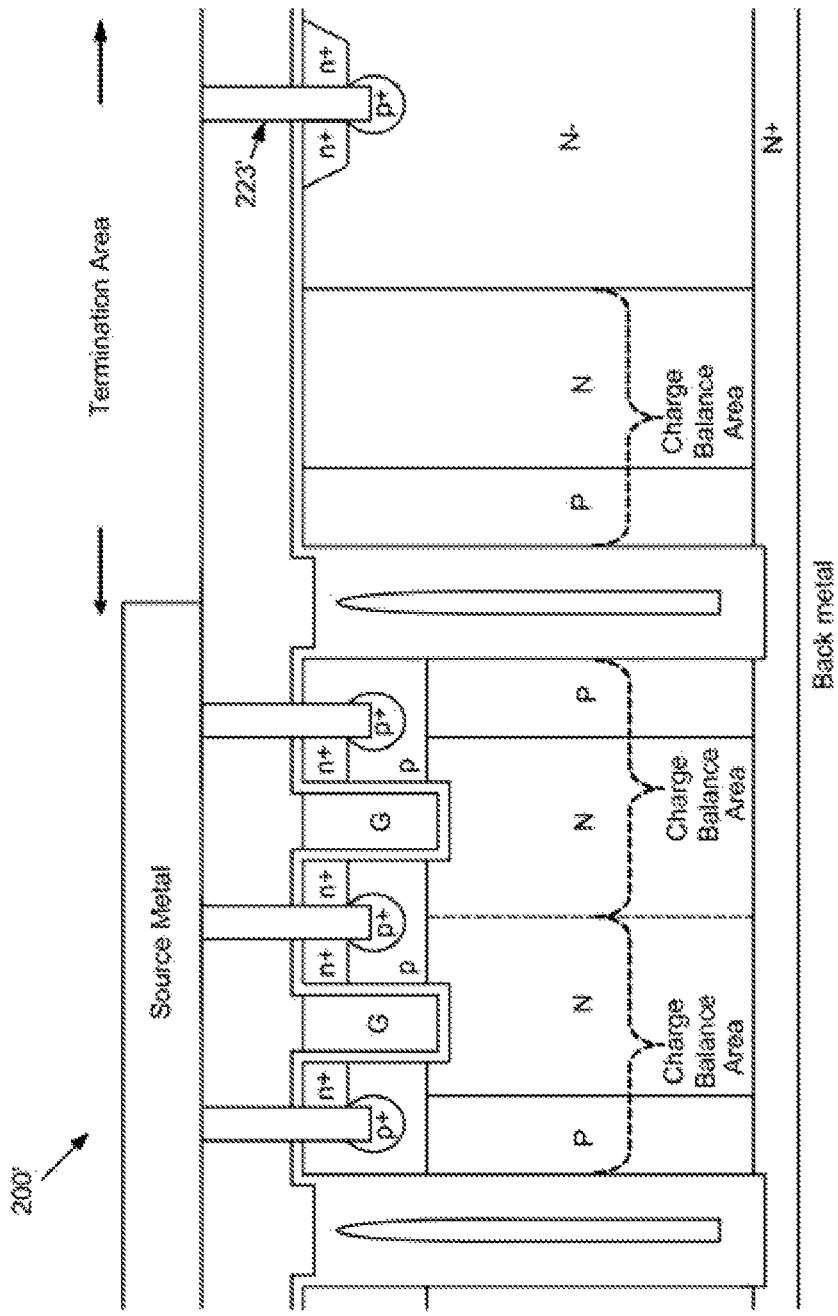
FIG. 2B is a cross-sectional view of another preferred embodiment according to the present invention.

FIG. 2B shows a cross-sectional view of another preferred super junction trench MOSFET 200' according to the present invention which has a similar structure as the super-junction trench MOSFET 200 in FIG. 2A except that in FIG. 2B, there is no EPR metal connected with the trenched termination contact 223' in the termination area.

Figure 2C:
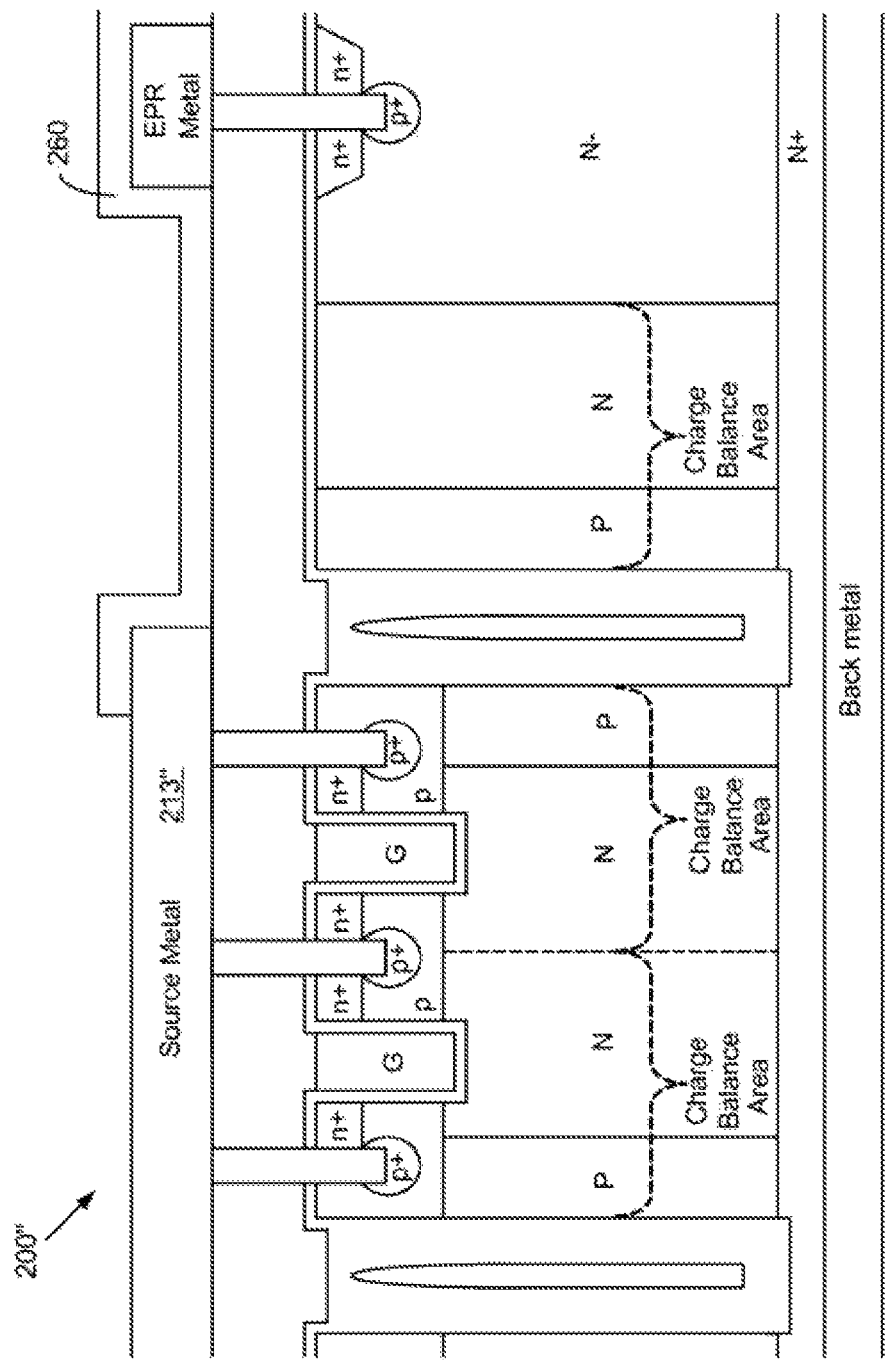
FIG. 2C is a cross-sectional view of another preferred embodiment according to the present invention.

FIG. 2C shows a cross-sectional view of another preferred super-junction trench MOSFET 200" according to the present invention which has a similar structure as the super-junction trench MOSFET 200 in FIG. 2A except that in FIG. 2C, the super-junction trench MOSFET 200" further comprises a passivation layer 260 covering a whole top surface of the termination area including a portion of a top surface of source metal 213" near the termination area.

Figure 3A:
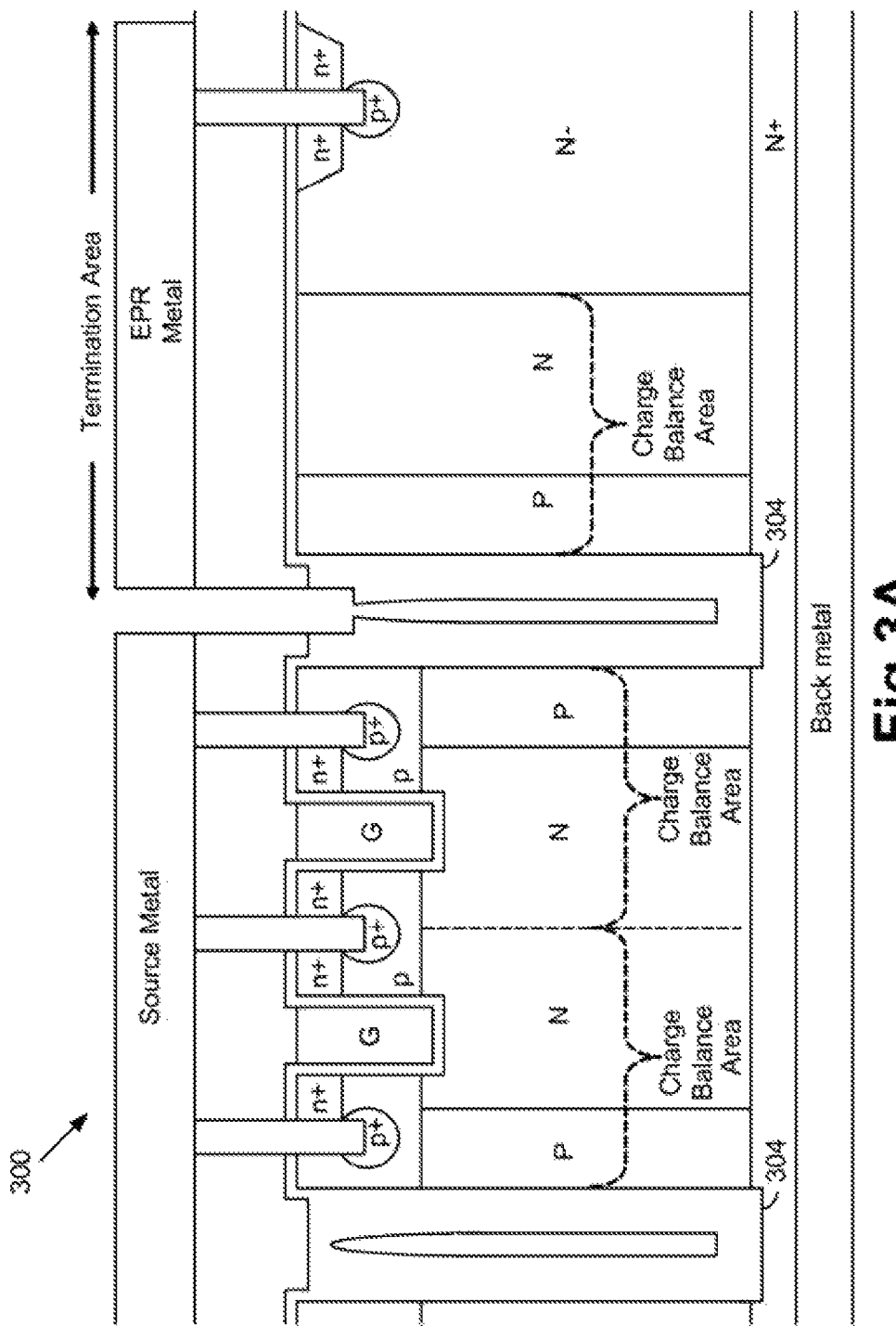
FIG. 3A is a cross-sectional view of another preferred embodiment according to the present invention.

FIG. 3A shows a cross-sectional view of another preferred super-junction trench MOSFET 300 according to the present invention which has a similar structure as the super-junction trench MOSFET 200 in FIG. 2A except that in FIG. 3A, the void inside the deep trench 304 adjacent to the termination area is opened up in air. Moreover, the EPR metal extends from the channel stop area toward active area and stop before the void.

Figure 3B:
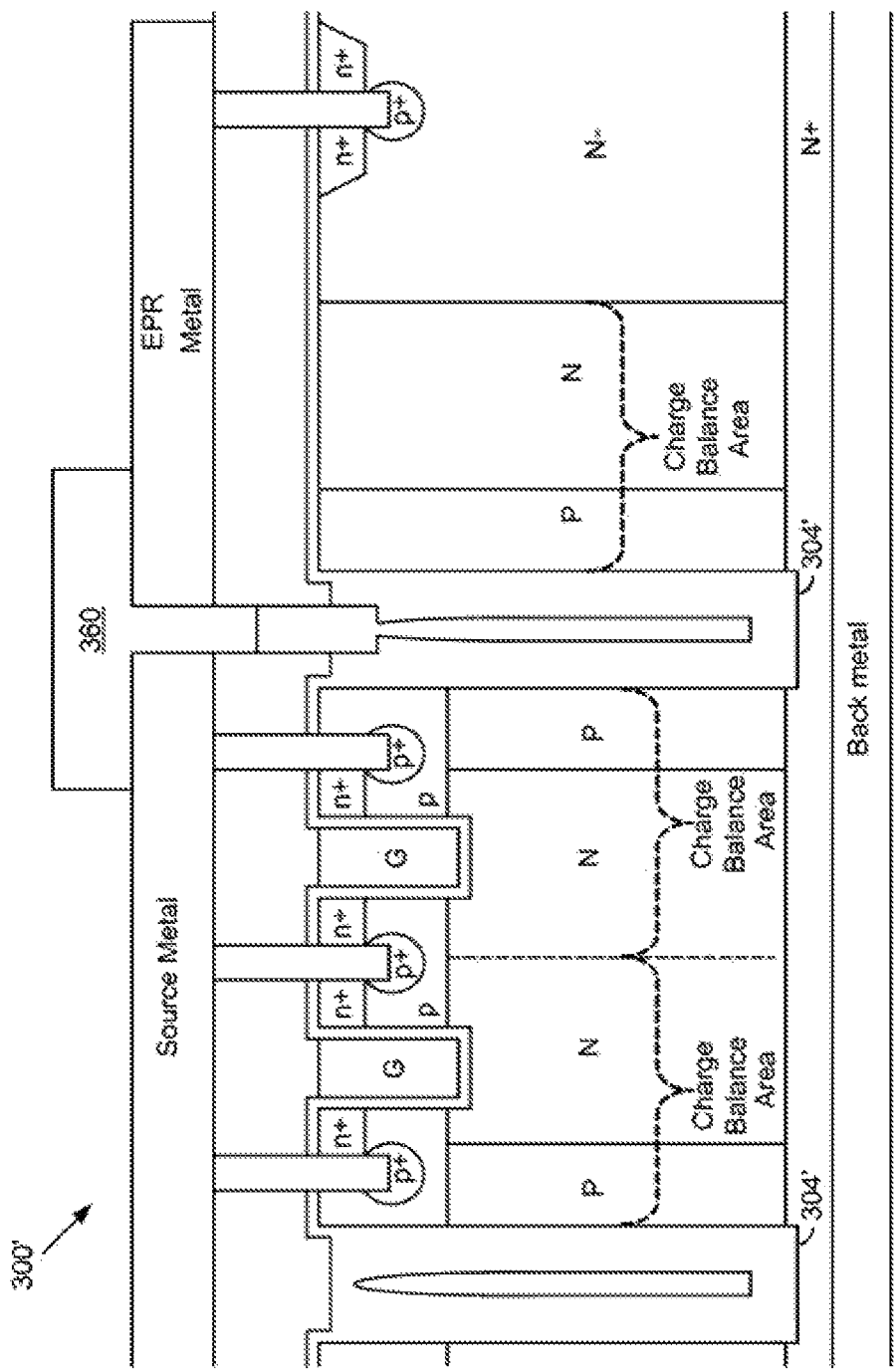
FIG. 3B is a cross-sectional view of another preferred embodiment according to the present invention.

FIG. 3B shows a cross-sectional view of another preferred super junction trench MOSFET 300' according to the present invention which has a similar structure as the super-junction trench MOSFET 300 in FIG. 3A except that in FIG. 3B, the super junction trench MOSFET 300' further comprises a passivation layer 360 covering above the void inside the deep trench 304' adjacent to the termination area.

Figure 4A:
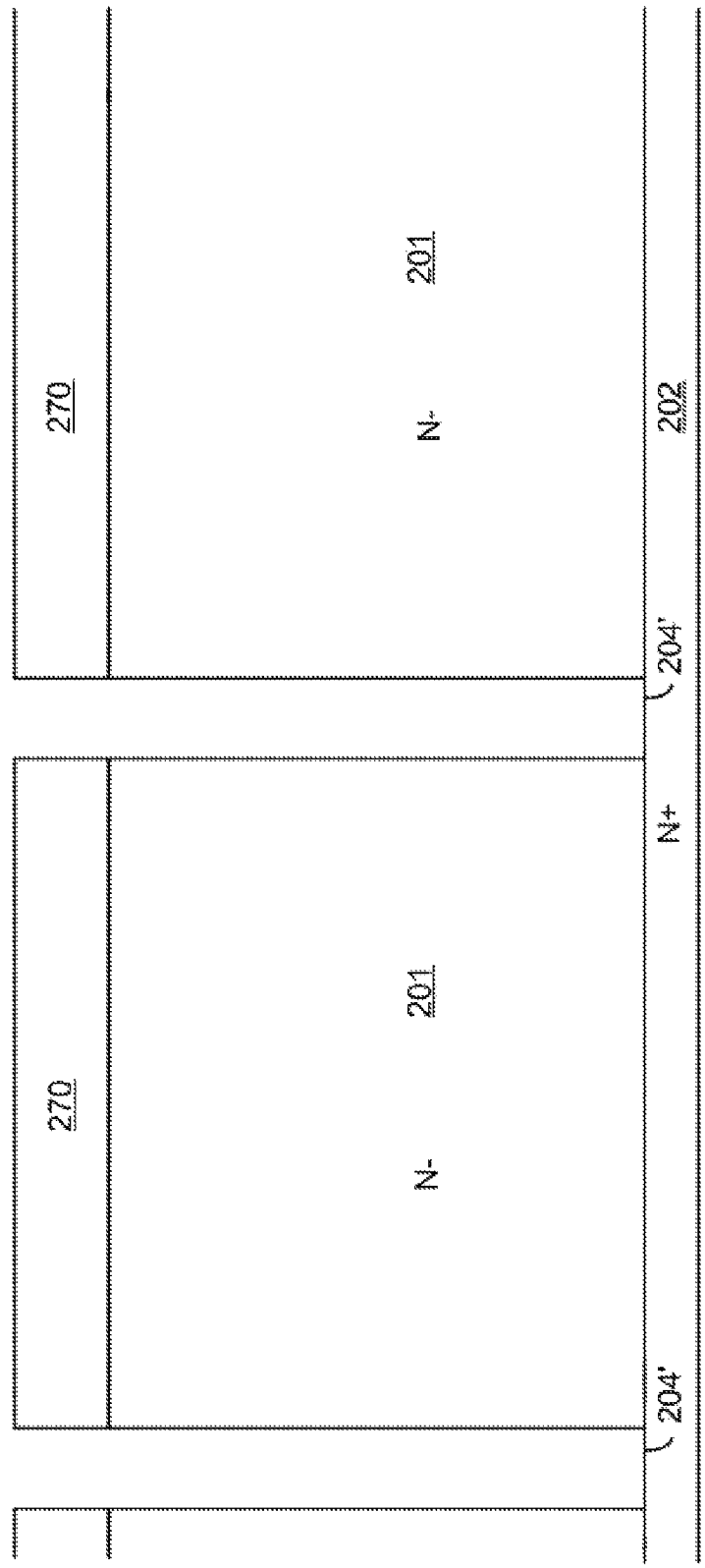

FIGS. 4A to 4K are a serial of exemplary steps that are performed to form the inventive super junction trench MOSFET 200 in FIG. 2A. In FIG. 4A, an N- epitaxial layer 201 is grown on an N+ substrate 202, wherein the N+ substrate 202 has a higher doping concentration than the N- epitaxial layer 201, and shares a common interface with the N- epitaxial layer 201. Next, a hard mask 270, which can be implemented by using an oxide layer, is formed covering a top surface of the N- epitaxial layer 201. Then, after a trench mask (not shown) is applied onto the hard mask 270, a plurality of deep trenches 204' are etched through the hard mask 270 and into the N- epitaxial layer 201 by successively dry oxide etch and dry silicon etch.

Figure 4B:
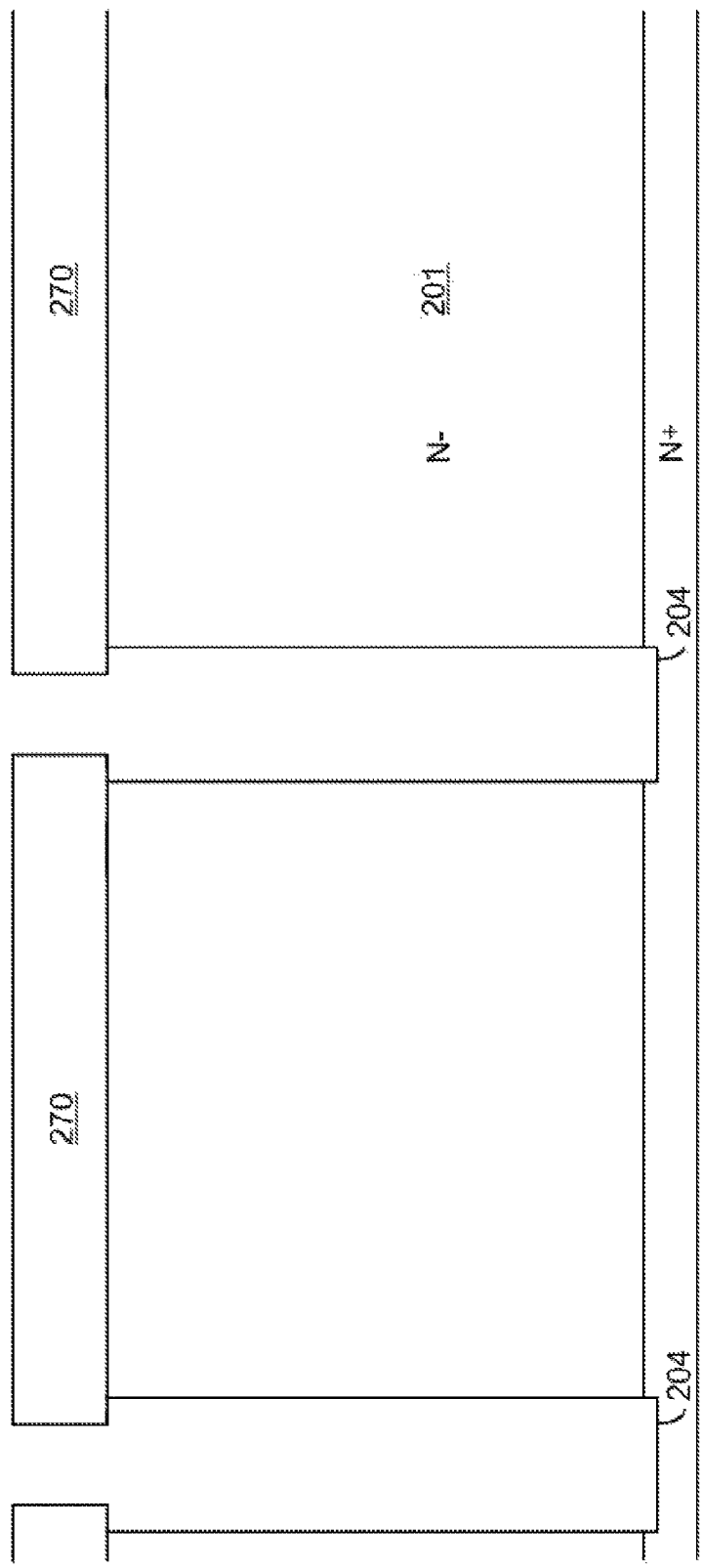

In FIG. 4B, an isotropic dry silicon etch in down stream plasma is carried out to eliminate the plasma damage introduced during opening the deep trenches 204' and to form the deep trenches 204. The hard mask 270 is still remained to block sequential angle ion implantations into the top surface of the N- epitaxial layer 201.

In FIG. 4C, a pad oxide 271 of about 100 angstroms in thickness is grown along inner surfaces of the deep trenches 204. Then, an angle ion implantation of Phosphorus dopant followed by a Phosphorus dopant drive-in step is carried out to form an N first doped column region 206 consist of two N sub-doped column regions 206' in a mesa between sidewalls of two adjacent deep trenches 204. In the termination area, an N third doped column 236 is simultaneously formed with the N first doped column 206.

In FIG. 4D, another angle ion implantation of Boron dopant is carried out and followed by a Boron dopant drive-in step to form a pair of P second doped column regions 207 with column shape adjacent to the sidewalls of the deep trenches 204, in parallel with and surrounding the N first doped column region 206. In the termination area, a P fourth doped column 237 is simultaneously formed with the P second doped column.

In FIG. 4E, the hard mask 270 (as shown in FIG. 4D) and the pad oxide 271 (as shown in FIG. 4D) are removed away. A dielectric material 205, for example tetra ethyl ortho silicate (TEOS, the same hereinafter) is formed filling the deep trenches 204 with a buried void 230 inside the dielectric material 205 and followed by an annealing process. Then, etching back or chemical mechanical polishing (CMP, the same hereinafter) the dielectric material 205 from the top surface of the N− epitaxial layer 201.

In FIG. 4F, a pad oxide layer 273 is formed on a top surface of the whole device structure in FIG. 4E. Then by applying a p body mask 274, p body ion implantation and diffusion are successively carried out to form a p body region 208 extending between two adjacent of the deep trenches 204 and near the top surface of the N− epitaxial layer 201. After that, the p body mask 274 is removed.

Figure 4G:
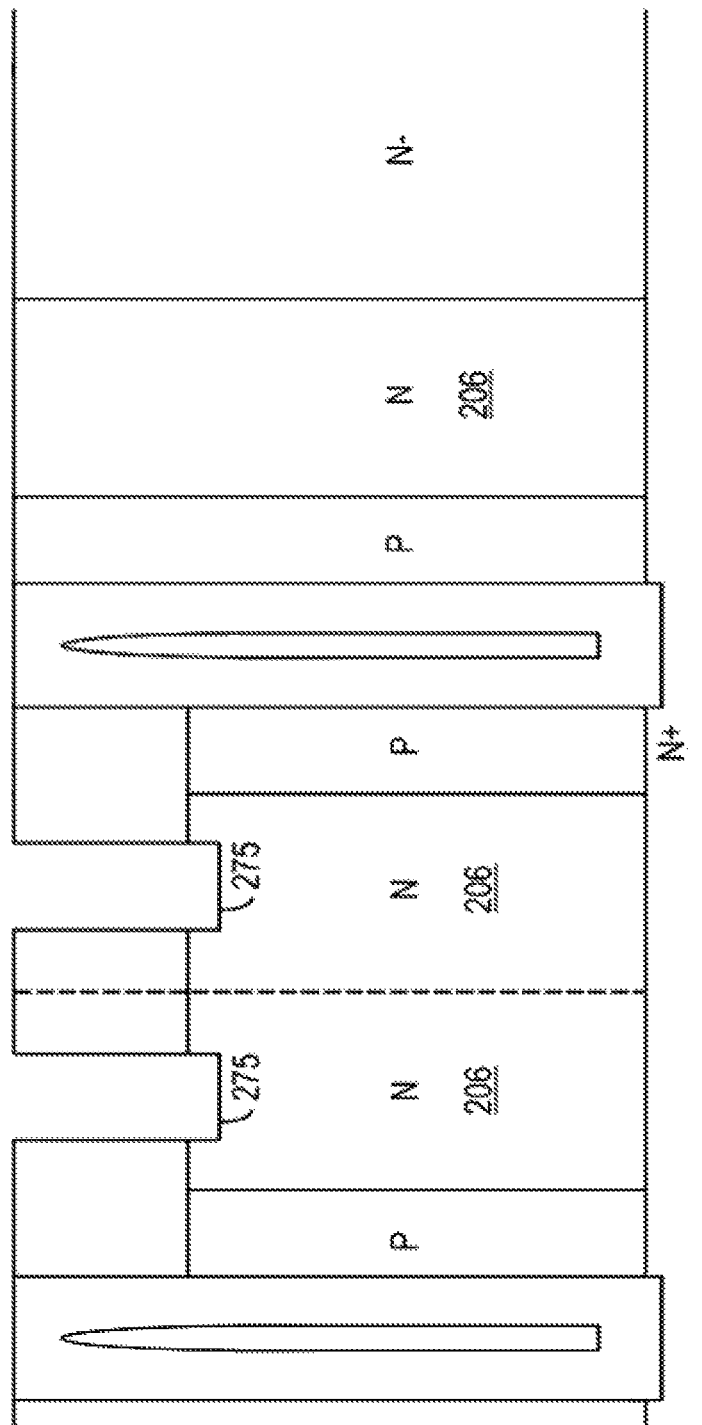

In FIG. 4G, after applying a gate trench mask (not shown), a plurality of gate trenches 275 are etched into the N first doped column region 206. Afterwards, a sacrificial oxide (not shown) is grown and then removed to eliminate the plasma damage introduced during opening the gate trenches 275.

Figure 4H:
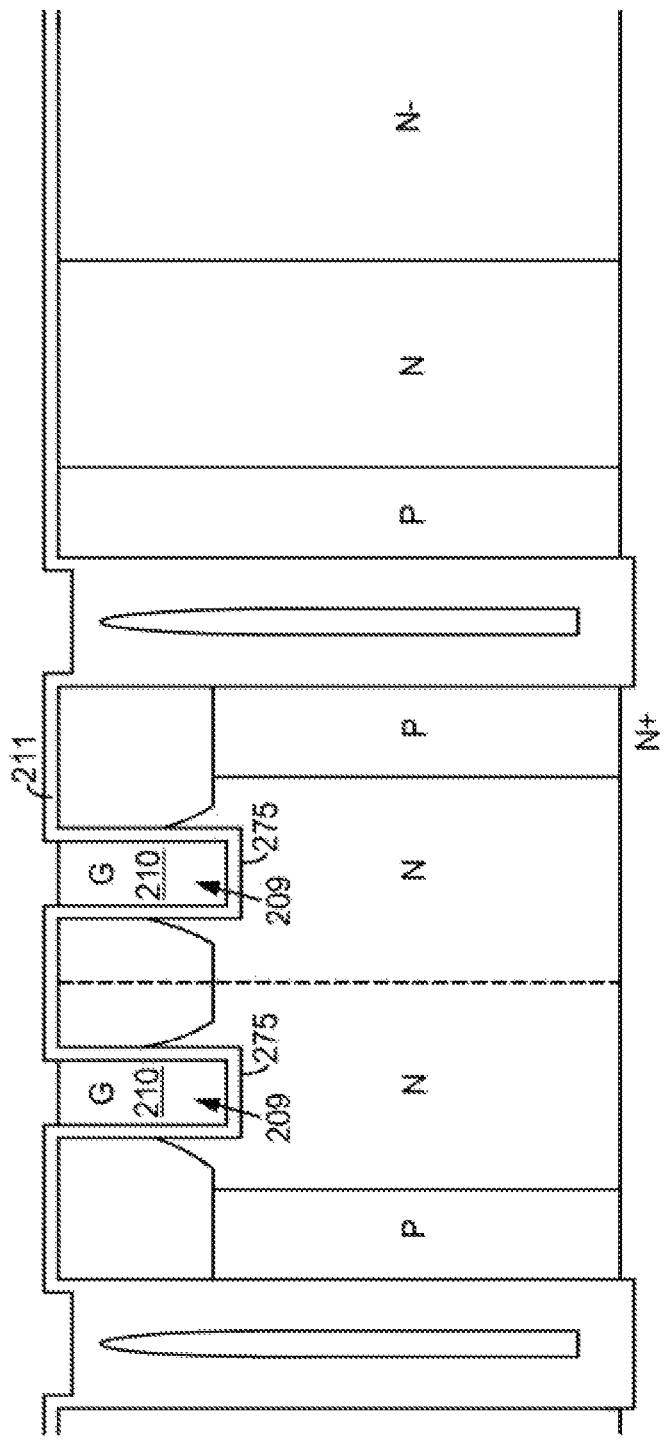

In FIG. 4H, a gate oxide layer 211 is grown along inner surfaces of the gate trenches 275. Then, a doped poly-silicon layer is deposited to fill the gate trenches 275, and then is etched back by CMP or plasma etch to serve as gate electrodes 210 for trenched gates 209.

Figure 4I:
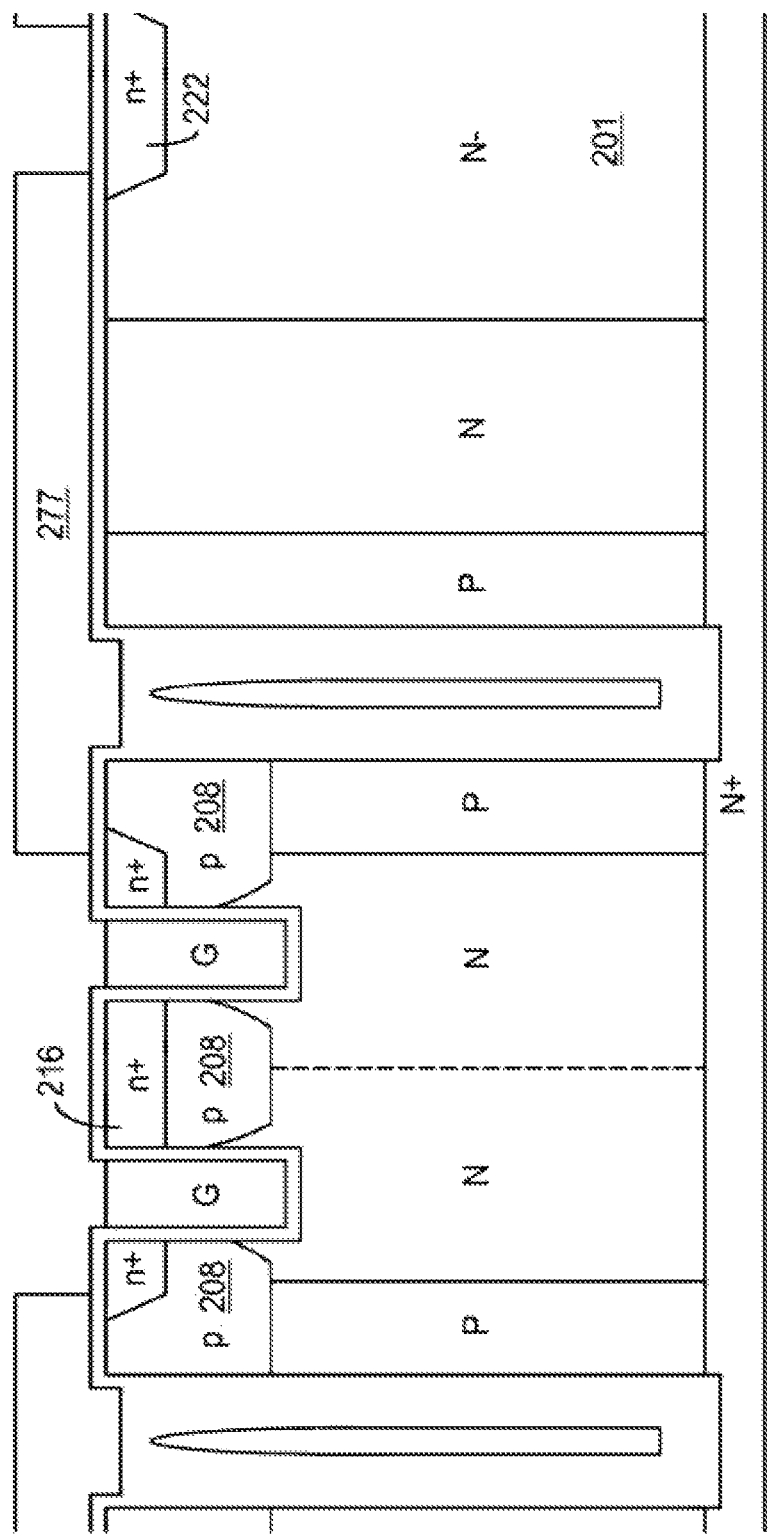

In FIG. 4I, by applying a source mask 277, an ion implantation of n type dopant and a diffusion step are carried out to form n+ source regions 216 near a top surface of the p body region 208 in active area, and an n+ channel stop region 222 near the top surface of the N− epitaxial layer 201 in termination area.

In FIG. 4J, an insulation layer is deposited onto a whole top surface of the device structure to serve as a contact interlayer 212. Then, after applying a contact mask (not shown) onto the contact interlayer 212, a plurality of contact holes 278 and 278' are formed by successively dry oxide etch and dry silicon etch. After penetrating through the contact interlayer 212, the contact holes 278 are further penetrating through the n+ source regions 216 and extending into the p body region 208 in the mesa, the contact hole 278' is extending into the N− epitaxial layer 201. Next, a BF2 ion implantation is performed and followed by a step of RTA (rapid thermal annealing) process to form a plurality of p+ body contact regions 221 and p+ body contact region 221' respectively surrounding at least bottoms of the contact holes 278 and 278'.

Figure 4K:
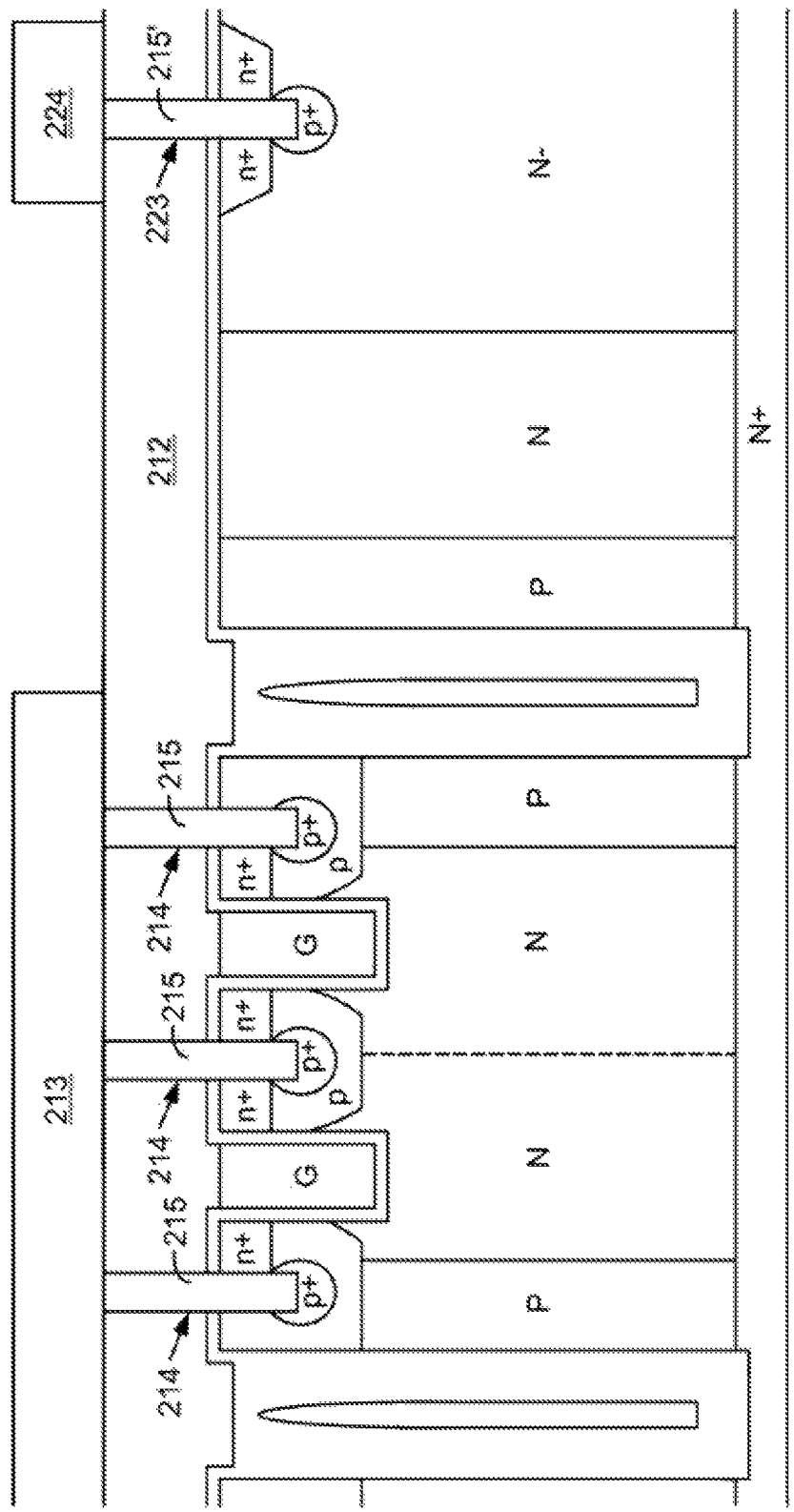

In FIG. 4K, a barrier metal layer Ti/TiN or Co/TiN or Ta/TiN is deposited on sidewalls and bottoms of all the contact holes. Then, a tungsten material layer is deposited onto the barrier metal layer, wherein the tungsten material layer and the barrier metal layer are then etched back to form: contact metal plugs 215 for trenched source-body contacts 214 and contact metal plug 215' for trenched termination contact 223. Then, a metal layer of Al alloys or Cu padded by a resistance-reduction layer Ti or Ti/TiN underneath is deposited onto the contact interlayer 212 and followed by a metal etching process by employing a metal mask (not shown) to form a source metal 213 and an EPR metal 224.

Figure 5A:
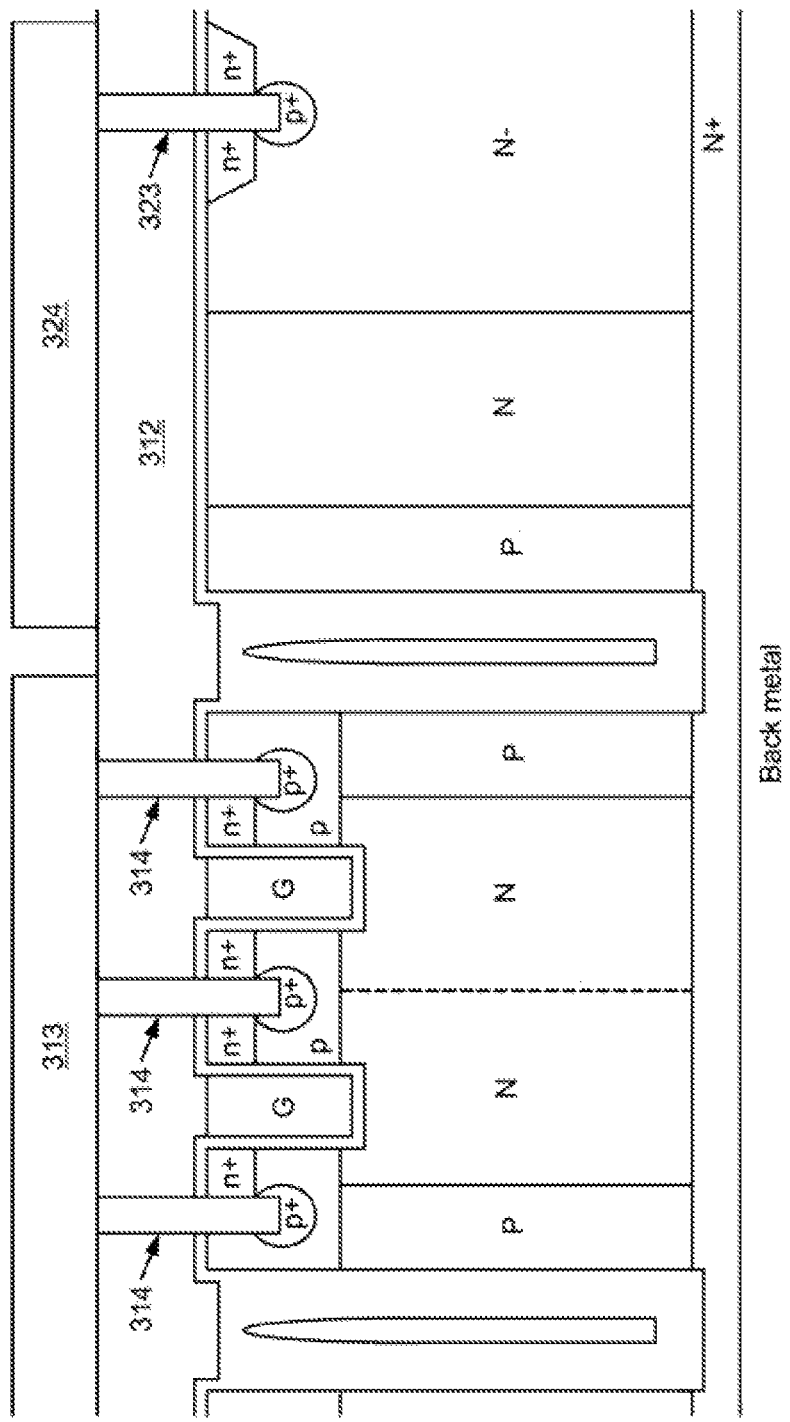
FIGS. 5A and 5B are cross-sectional views for showing the processing steps for forming the opened up void of another super-junction trench MOSFET according to the present invention.
Figure 5B:
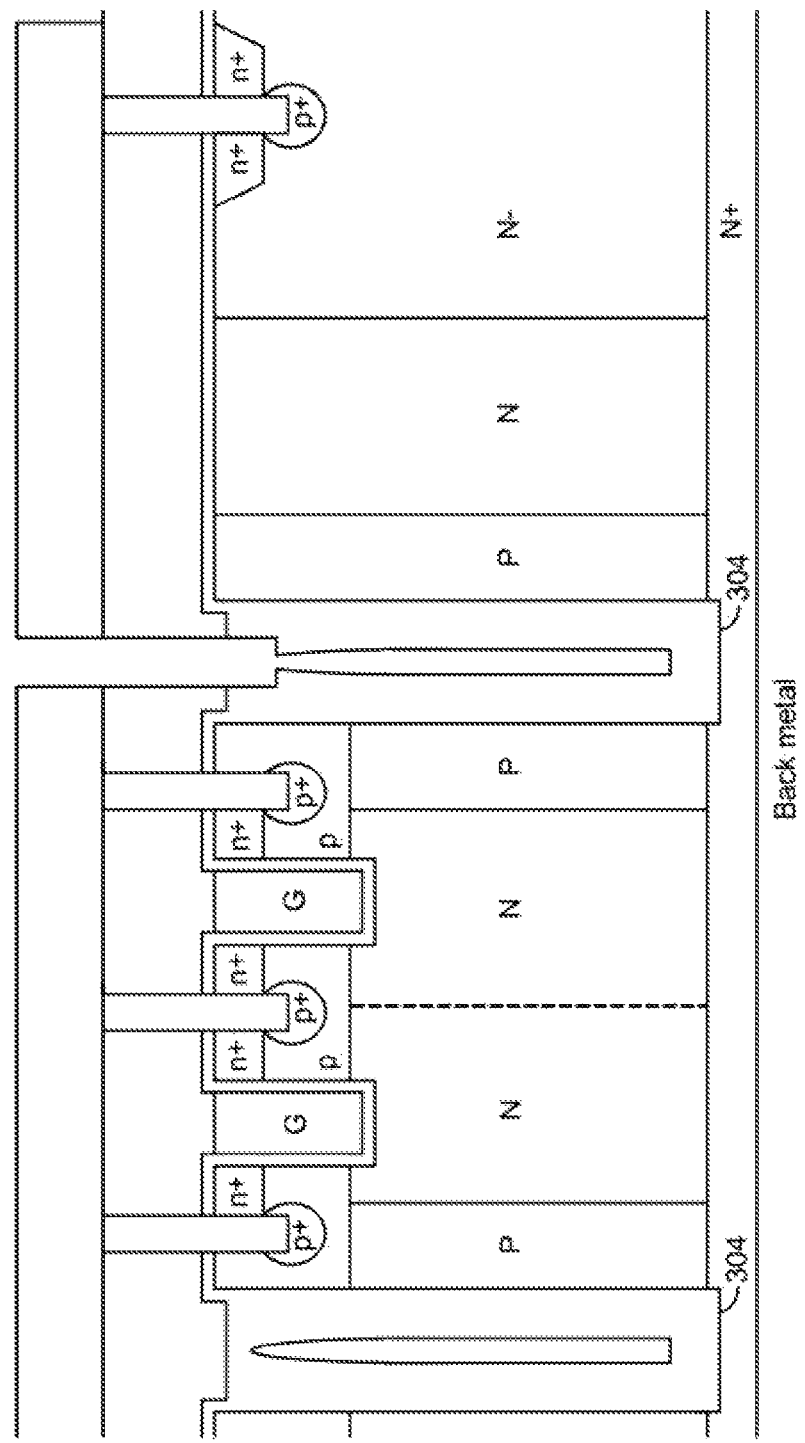

FIGS. 5A and 5B show processing steps for forming the opened up void of the inventive super-junction trench MOSFET 300 in FIG. 3A. After formation of trenched source-body contacts 314 and trenched termination contact 323, a metal layer of Al alloys or Cu padded by a resistance-reduction layer Ti or Ti/TiN underneath is deposited onto the contact interlayer 312 and followed by a metal etching process by employing a metal mask (not shown) to form a source metal 313 and an EPR metal 324. Then in FIG. 5B, a dry oxide etch is performed to open up the void inside the deep trench 304 adjacent to the termination area by removing oxide in the upper portion.

FIG. 6 is a top view of super-junction trench MOSFETs with square closed cell layout. Closed gate trenches 601 surround a deep trench 602 in each unit cell, wherein the deep trench 602 has square shape. Trenched source-body contacts 603 are disposed between the closed gate trenches 601 and the deep trench 602 in each the unit cell, wherein the trenched source-body contacts 603 have square shape. In some embodiments, the deep trench 602 has rectangular, circle or hexagon shape as an alternative. Trenched source-body contacts 603' are disposed between the adjacent closed gate trenches 601.

Figure 7:
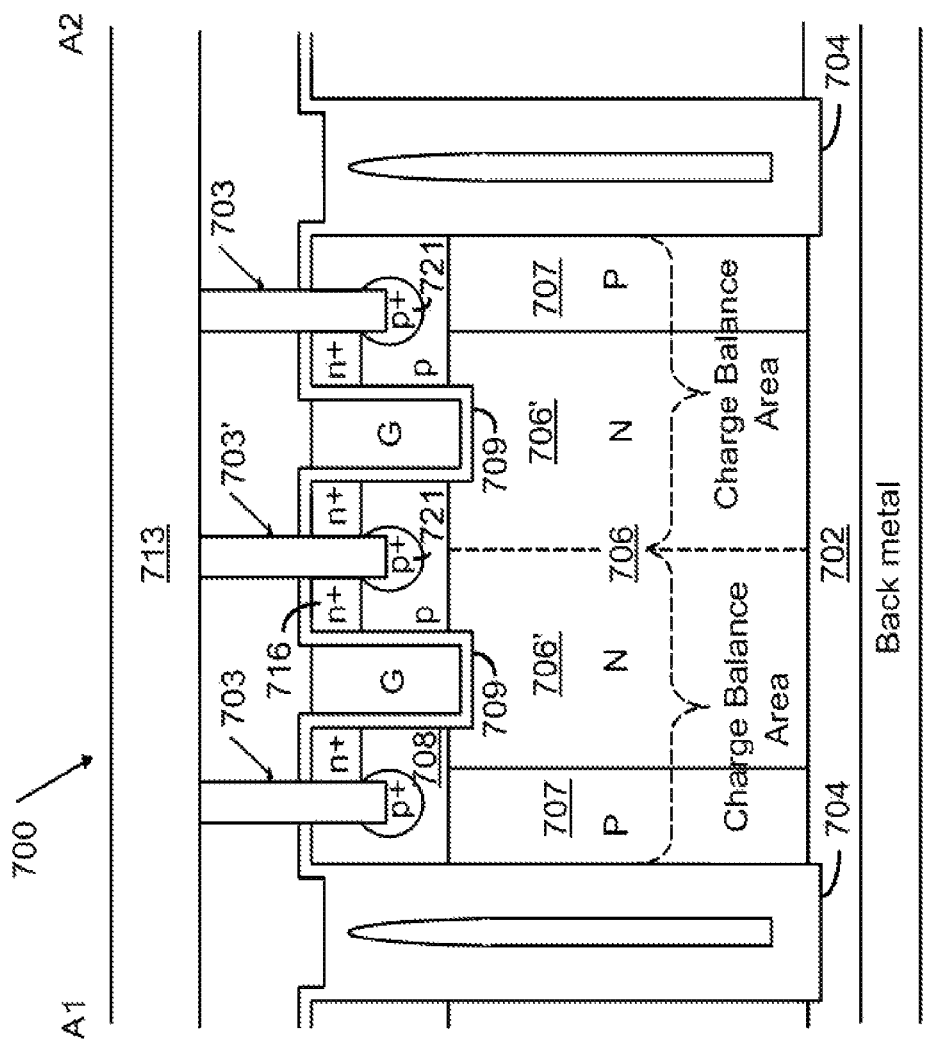
FIG. 7 is a cross-sectional view of A1-A2 in FIG. 6.

FIG. 7 is a cross-sectional view of A1-A2 in FIG. 6. N-channel super-junction trench MOSFET 700 comprises a plurality of unit cells with each comprising a plurality of deep trenches 704 formed starting form a top surface of an N− epitaxial layer and vertically down extending into the N+ substrate 702. A mesa is therefore formed between every two adjacent of the deep trenches 704 in each unit cell wherein an N first doped column region 706 consist of two N sub-doped column regions 706' each having half column width of the N first doped column region 706 is formed. Adjacent to sidewalls of the deep trenches 704, a pair of P second doped column regions 707 is formed in the mesa and in parallel surrounding with the N first doped column region 706. A first type charge balance area comprising two P/N charge balance areas is formed in the mesa area between the adjacent deep trenches. The N first doped column region 706 and the P second doped column regions 707 all have column bottoms above trench bottoms of the deep trenches 704. Onto a top surface of the N first doped column region 706 and the P second doped column regions 707, a p body region 708 is formed between in the mesa extending between every two adjacent of the deep trenches 704. A pair of gate trenches 709 is penetrating through the p body region 708 further extending into the N first doped column region 706 in each unit cell. In some preferred embodiments, there is only one gate trench penetrating through the p body region further extending into the N first doped column region in each unit cell as an alternative. In each the mesa, multiple trenched source-body contacts 703 with each filled with a tungsten plug padded by a barrier metal layer of Ti/TiN or Co/TiN or Ta/TiN are formed between the deep trench 704 and the gate trench 709 in each unit cell, and trenched source-body contact 703' filled with the tungsten plug padded by the barrier metal layer of Ti/TiN or Co/TiN or Ta/TiN are formed between the adjacent gate trench 709. Therefore, the p body region 708 and the n+ source region 716 are connected to the source metal 713 via the multiple trenched source-body contacts 703 and 703'. Furthermore, a p+ body contact region 721 is formed surrounding at least bottom of each the trenched source-body contact 703 and 703' to reduce the contact resistance between the tungsten plugs and the p body region 708.

Figure 8:
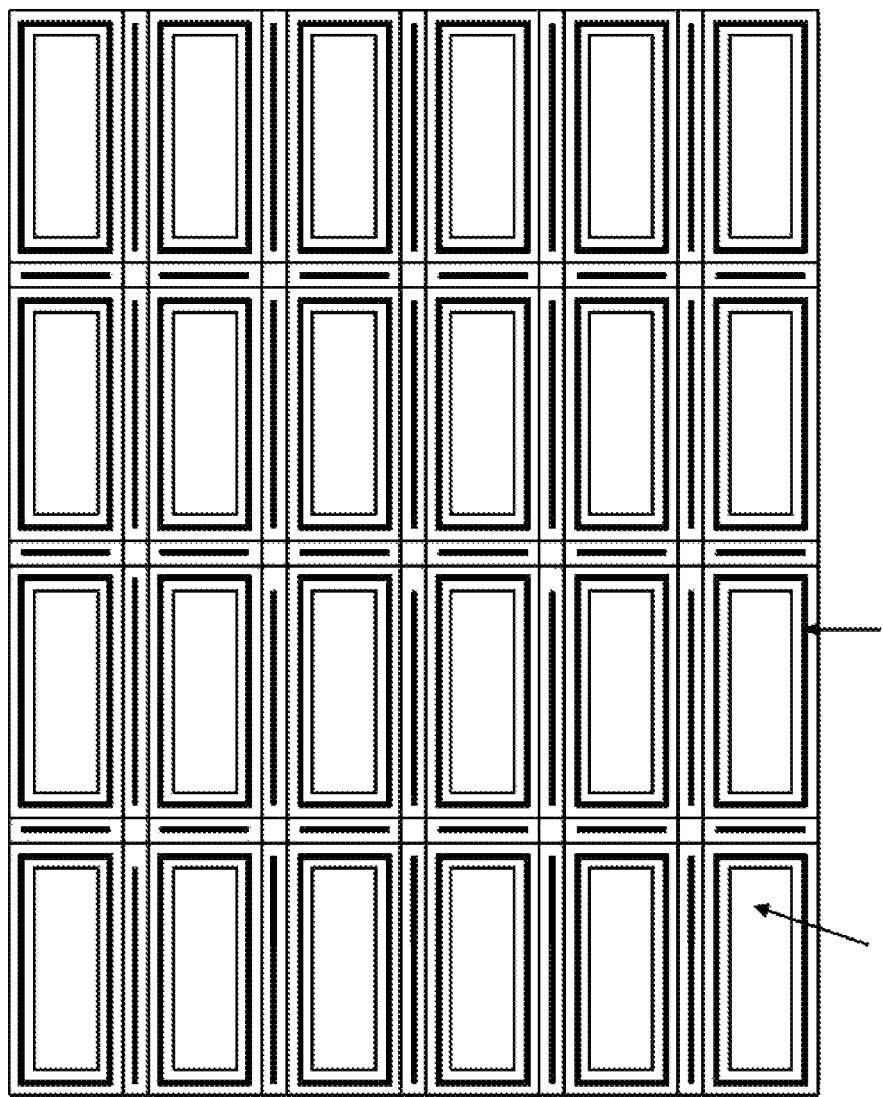
FIG. 8 is a top view of super junction trench MOSFETs with rectangular closed cells in single orientation layout.

FIG. 8 shows super-junction trench MOSFETs with rectangular closed cells in single orientation layout, which has a similar structure as the super-junction trench MOSFETs in FIG. 6 except that in FIG. 8, the deep trench 802 and the trenched source-body contacts 803 has rectangular shape.

Figure 9:
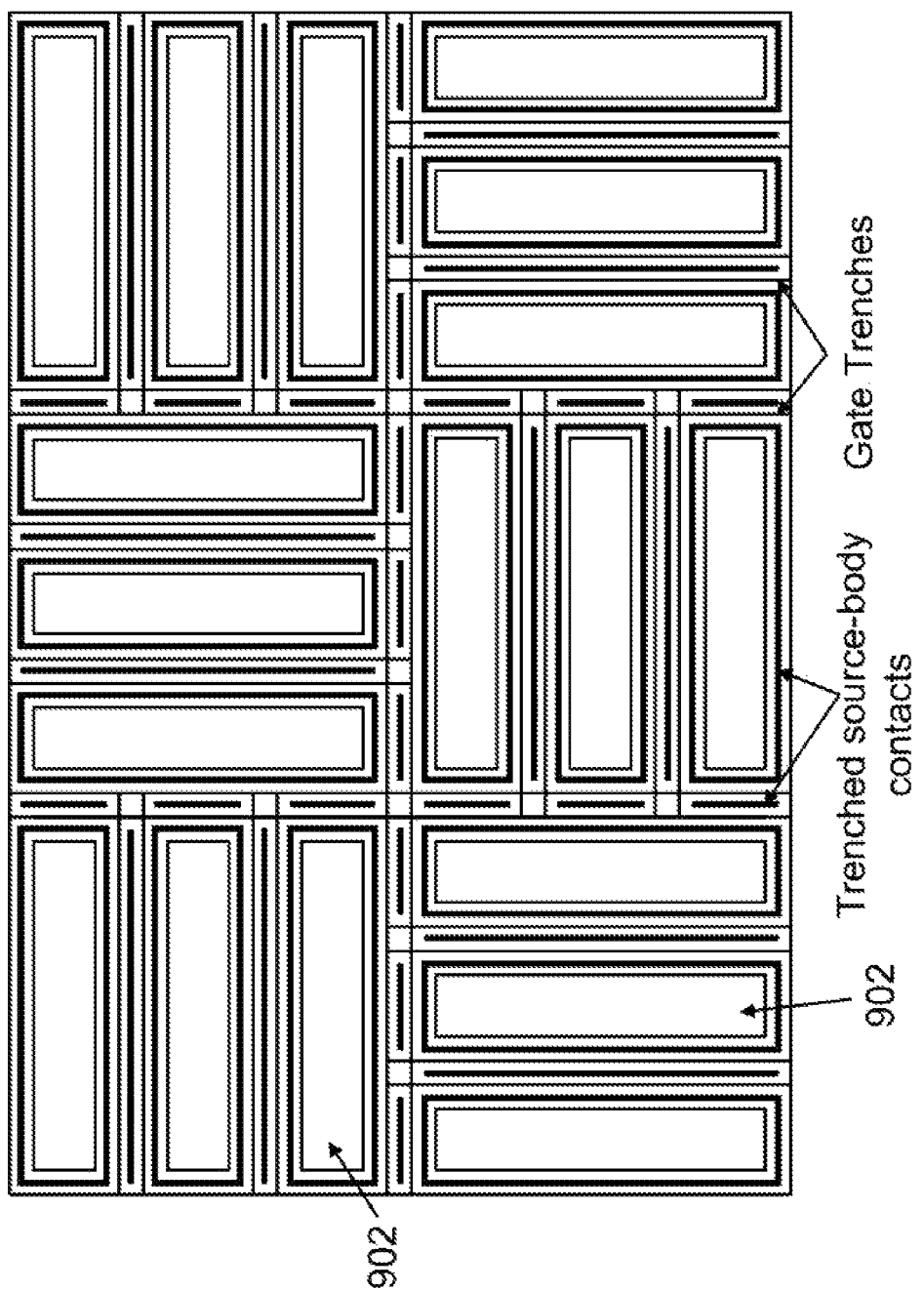
FIG. 9 is a top view of super junction trench MOSFETs with rectangular closed cells in multiple orientations layout.

FIG. 9 shows super-junction trench MOSFETs with rectangular closed cells in multiple orientations layout, which has a similar structure as the super-junction trench MOSFETs in FIG. 8 except that in FIG. 9, the layout of the deep trenches 902 have multiple orientations, for example, in horizontal direction and in vertical direction.

Figure 10:
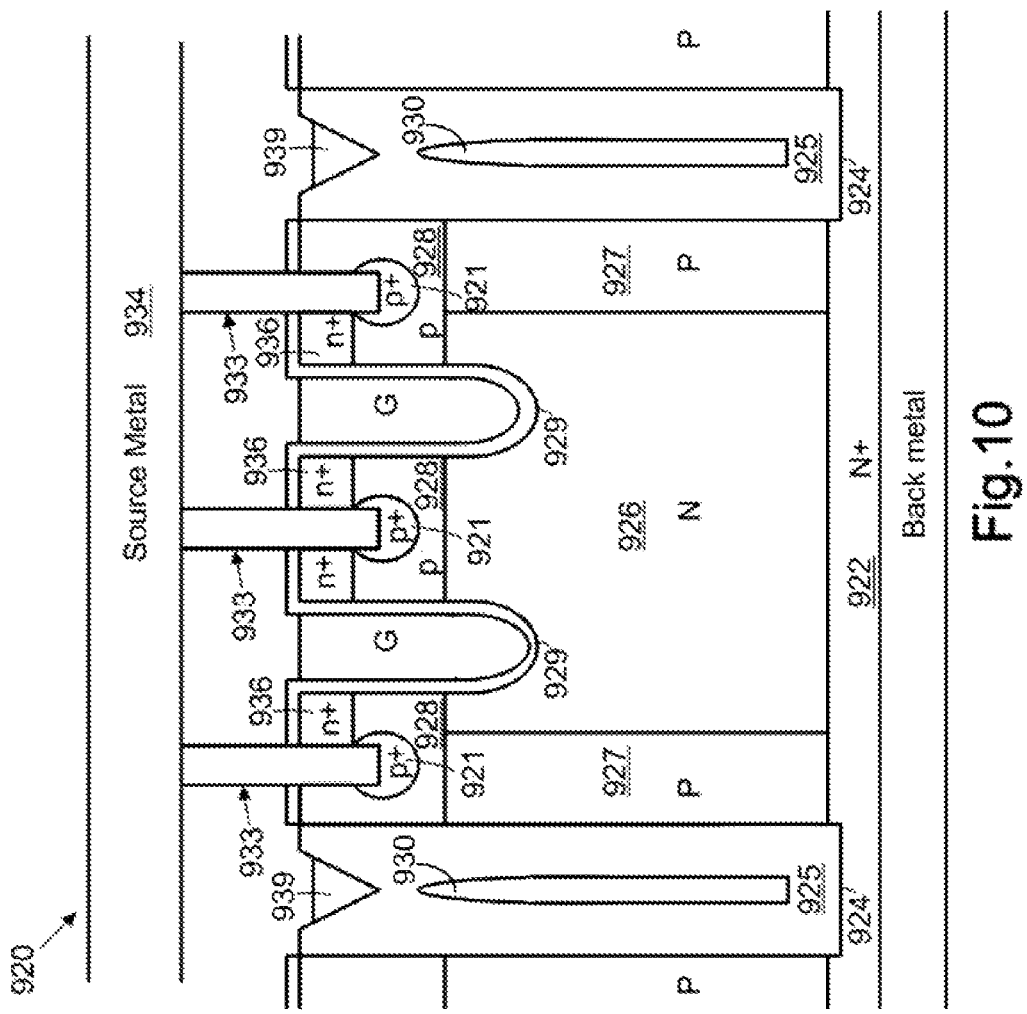
FIG. 10 is a cross-sectional view of another preferred embodiment according to the present invention.

FIG. 10 is a cross-sectional view of another preferred embodiment 920 according to the present invention. The N-channel super-junction trench MOSFET 920 comprises a plurality of unit cells with each comprising a plurality of deep trenches 924 formed starting form a top surface of an N-epitaxial layer and vertically down extending into the N+ substrate 922. A mesa is therefore formed between every two adjacent of the deep trenches 924 in each unit cell wherein an N first doped column region 926 is formed. Adjacent to sidewalls of the deep trenches 924, a pair of P second doped column regions 927 is formed in the mesa and in parallel surrounding with the N first doped column region 926. A charge balance area comprising two P/N charge balance areas is formed in the mesa area between the adjacent deep trenches 924. The N first doped column region 926 and the P second doped column regions 927 all have column bottoms above trench bottoms of the deep trenches 924. Onto a top surface of the N first doped column region 926 and the P second doped column regions 927, a p body region 928 is formed between in the mesa extending between every two adjacent of the deep trenches 924. A pair of gate trenches 929 is penetrating through the p body region 928 further extending into the N first doped column region 926 in each unit cell. In some preferred embodiments, there is only one gate trench penetrating through the p body region further extending into the N first doped column region in each unit cell as an alternative. In each the mesa, multiple trenched source-body contacts 933 with each filled with a tungsten plug padded by a barrier metal layer of Ti/TiN or Co/TiN or Ta/TiN are formed between the deep trench 924 and the gate trench 929 in each unit cell Therefore, the p body region 928 and a plurality of n+ source regions 936 are connected to a source metal 934 via the multiple trenched source-body contacts 933. Furthermore, a p+ body contact region 921 is formed surrounding at least bottom of each the trenched source-body contact 933 to reduce the contact resistance between the tungsten plugs and the p body region 928. Inside each of the deep trenches 924, a layer of buffer poly-silicon 939 is deposited on top of a void 930 and isolated from the dielectric material 925 for stress release to prevent silicon defects and wafer crack. The buffer poly-silicon 939 can be implemented by using non-doped poly-silicon or doped poly-silicon, and meanwhile, the buffer poly-silicon 939 can be implemented to have floating voltage or be connected with said source metal 934.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A super-junction trench MOSFET comprising:
   a substrate of a first conductivity type;
   an epitaxial layer of said first conductivity type grown on said substrate, and said epitaxial layer having a lower doping concentration than said substrate;
   a pair of deep trenches filled with dielectric material, starting from a top surface of said epitaxial layer and down extending into said substrate, each of said deep trenches comprising a void inside said dielectric material;
   a buffer poly-silicon layer deposited above said void insolated with said dielectric material;
   a first doped column region of said first conductivity type with column shape formed in an area between said pair of deep trenches;
   a pair of second doped column regions of a second conductivity type with column shape formed adjacent to sidewalls of said deep trenches, said first doped column region being formed in parallel and sandwiched between said pair of second doped column regions to form charge balance areas.

2. The super-junction trench MOSFET of claim 1 further comprising:
   a body region of said second conductivity type, covering a top surface of said first and second doped column regions, extending between said pair of deep trenches;
   at least one gate trench filled with a doped poly-silicon layer padded by a gate oxide layer, starting from the top surface of said epitaxial layer and down penetrating through said body region and extending into said first doped column;
   a plurality of trenched source-body contacts with each filled with a contact metal plug extending into said body region; and
   a source region of said first conductivity type adjacent to an upper portion of said gate trench, extending between the upper portion of said gate trench and sidewalls of an adjacent trenched source-body contacts.

3. The super-junction trench MOSFET of claim 1, wherein said buffer poly-silicon is non-doped poly-silicon.

4. The super-junction trench MOSFET of claim 1, wherein said buffer poly-silicon is doped poly-silicon.

5. The super-junction trench MOSFET of claim 1, wherein said buffer poly-silicon has a floating voltage.

6. The super-junction trench MOSFET of claim 1, wherein said buffer poly-silicon is connected with a source metal.

7. The super-junction trench MOSFET of claim 1 further comprising a body contact region of said second conductivity type, surrounding at least a bottom of each of said trenched source-body contacts, wherein said body contact region has a higher doping concentration than said body region.

8. The super-junction trench MOSFET of claim 1, wherein said contact metal plug is a tungsten plug padded by a barrier metal layer of Ti/TiN or Co/TiN or Ta/TiN.

* * * * *